(12) United States Patent
Armstrong et al.

(10) Patent No.: US 7,633,675 B2
(45) Date of Patent: Dec. 15, 2009

(54) CATADIOPTRIC IMAGING SYSTEM EMPLOYING IMMERSION LIQUID FOR USE IN BROAD BAND MICROSCOPY

(75) Inventors: J. Joseph Armstrong, Milpitas, CA (US); Yung-Ho Chuang, Cupertino, CA (US); David R. Shafer, Fairfield, CT (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/999,558

(22) Filed: Dec. 5, 2007

(65) Prior Publication Data

US 2008/0247035 A1    Oct. 9, 2008

Related U.S. Application Data

(63) Continuation of application No. 10/812,111, filed on Mar. 29, 2004, now Pat. No. 7,307,783, which is a continuation-in-part of application No. 10/646,073, filed on Aug. 22, 2003, which is a continuation-in-part of application No. 10/434,374, filed on May 7, 2003, now Pat. No. 7,180,658.

(60) Provisional application No. 60/449,326, filed on Feb. 21, 2003.

(51) Int. Cl.
*G02B 17/08*    (2006.01)

(52) U.S. Cl. .................. 359/364; 359/355; 359/357; 359/727

(58) Field of Classification Search .............. 359/351, 359/355–357, 364–366, 368, 727–731, 858, 359/859, 861
See application file for complete search history.

(56) References Cited

U.S. PATENT DOCUMENTS

| 4,043,638 | A | 8/1977 | Kaufmann |
| 4,108,794 | A | 8/1978 | Yonekubo |
| 5,159,495 | A | 10/1992 | Shafer et al. |
| 5,717,518 | A | 2/1998 | Shafer et al. |
| 5,825,043 | A | 10/1998 | Suwa |
| 6,483,638 | B1 | 11/2002 | Shafer et al. |

(Continued)

FOREIGN PATENT DOCUMENTS

WO    WO 2005/022204 A    3/2005

OTHER PUBLICATIONS

Harry Paul: "Lexikon der Optik, M bis Z" 2003, Spektrum Akademischer Verlag GMBH, Heidelberg, Berlin, XP002469740 pp. 44-47.

(Continued)

*Primary Examiner*—Lee Fineman
(74) *Attorney, Agent, or Firm*—Smyrski Law Group, A P.C.

(57) ABSTRACT

A reduced size catadioptric inspection system employing a catadioptric objective and immersion substance is disclosed. The objective may be employed with light energy having a wavelength in the range of approximately 190 nanometers through the infrared light range, and can provide numerical apertures in excess of 0.9. Elements are less than 100 millimeters in diameter and may fit within a standard microscope. The objective comprises a focusing lens group, a field lens, a Mangin mirror arrangement, and an immersion substance or liquid between the Mangin mirror arrangement and the specimen. A variable focal length optical system for use with the objective in the catadioptric inspection system is also disclosed.

32 Claims, 13 Drawing Sheets

U.S. PATENT DOCUMENTS

2001/0040722 A1 11/2001 Shafer et al.
2004/0165257 A1 8/2004 Shafer et al.
2004/0240047 A1 12/2004 Shafer et al.

OTHER PUBLICATIONS

Eugene Hecht/Alfred Zajac: "Optics" 1974, Addison-Wesley Publishing Company, Reading, Massachusetts, XP002469741 pp. 149-151.

CATADIOPTRIC IMAGING SYSTEM EMPLOYING IMMERSION LIQUID FOR USE IN BROAD BAND MICROSCOPY

This application is a continuation of U.S. application Ser. No. 10/812,111, entitled "Catadioptric Imaging System Employing Immersion Liquid for Use in Broad Band Microscopy", inventors J. Joseph Armstrong, et al., filed Mar. 29, 2004, now U.S. Pat. No. 7,307,783, which is a continuation-in-part of U.S. patent application Ser. No. 10/646,073, entitled "Catadioptric Imaging System for Broad Band Microscopy," inventors David G. Shafer, et al., filed Aug. 22, 2003, which is a continuation-in-part of U.S. patent application Ser. No. 10/434,374, entitled "High Performance Catadioptric Imaging System," inventors David G. Shafer, et al., filed May 7, 2003, now U.S. Pat. No. 7,180,658, which claims the benefit of U.S. Provisional Patent Application Ser. No. 60/449,326, entitled ~High Performance, Low Cost Catadioptric Imaging System," filed Feb. 21, 2003, all of which are incorporated herein by reference.

BACKGROUND OF THE INVENTION

1. Field of the Invention

The present invention relates generally to the field of optical imaging and more particularly to catadioptric optical systems used for microscopic imaging, inspection, and lithography applications.

2. Description of the Related Art

Many optical systems have the ability to inspect or image features on the surface of a specimen, such as inspecting defects on a semiconductor wafer or photomask, or alternately examining a biological specimen on a slide. Microscopes have been used in various imaging situations, including biology, metrology, semiconductor inspection, and other complex inspection applications where high resolution images of small areas and/or features are desired.

Typically available imaging systems include microscopes, which use offer inspection using dry imaging, or imaging in a gaseous medium such as air. Many newer applications either require or may benefit from immersion imaging. Unlike dry imaging, immersion imaging immerses the sample in water or other liquid and images or inspects the image within the liquid. Immersion imaging can, in certain circumstances, provide increased optical properties, including but not limited to enhanced resolution, over dry imaging. Furthermore, due to the nature and fragile properties associated with certain biological specimens, biological imaging systems frequently cannot use dry imaging whatsoever. In this situation, a biological imaging system can only image a sample while the sample is immersed in liquid, necessitating the use of a system able to perform immersion imaging.

Problems with immersion imaging and objectives employed within immersion imaging systems include the ability to resolve the image using immersion imaging operation in the presence of either low wavelength or broad wavelength range light energy, successfully employing different types of illumination and imaging modes, and effective objective usage in widely available standard equipment, such as microscopes.

Microscopes designed to support immersion imaging can be difficult to design for high resolution specimen imaging. To improve the quality of the image received, such a system may use various imaging modes to enhance the appearance of desired features on the specimen. Imaging modes used in an immersion imaging system may include bright field, dark field, differential interference contrast, confocal, and other imaging modes offering different benefits depending on the type of specimen, the features on the specimen being observed, the imaging environment, and other related considerations.

Certain imaging modes may employ light energy of varying wavelengths, and thus the ability to effectively resolve images and operate in the presence of a wide variety of wavelengths and over various wavelength ranges may be particularly beneficial. For immersion imaging, the system objective is one of the most critical components of the design and may use light having a broad range of wavelengths, including wavelengths below 400 nm. Some available UV objectives can transmit light at wavelengths down to a wavelength of 340 nm, but these objectives do not provide accurate imaging performance for light wavelengths below the range of approximately 400 nm. These types of objectives are mainly used for fluorescence, where wavelengths from 340 nm through the visible light spectrum excite fluorescence components in marker dyes. The fluorescent emission for these objectives is typically in the visible light spectrum, so imaging performance in the visible light spectrum is the specific type of performance required. Such fluorescence excitation does not perform an inspection of the specimen and thus such an objective provides limited, if any, inspection functionality.

The ability for an objective to operate within a standard microscope is both desirable and difficult to achieve for the detailed inspection performance required for semiconductor and biological inspections discussed above. No immersion objectives are currently known that can support broad band inspection performance at light wavelengths below 400 nm. Some dry objective designs may be highly corrected for broad band imaging at wavelengths below 400 nm, but none of these dry objective designs can be used in a standard microscope system. The dry objective designs are typically too large, have insufficient numerical aperture (NA), or have an insufficient field size.

It would therefore be beneficial to provide a system and objective for use in conjunction with standard microscopes and microscopy applications that overcome the foregoing drawbacks present in previously known dry imaging/immersion imaging systems. Further, it would be beneficial to provide an optical inspection system design having improved functionality over devices exhibiting the negative aspects described herein.

SUMMARY OF THE INVENTION

According to a first aspect of the present invention, there is provided an objective employed for use in inspecting a specimen. The objective is employed with light energy having a wavelength in a range of approximately 266 to 1000 nanometers. The objective comprises a focusing lens group comprising at least one focusing lens configured to receive the light energy and form focused light energy, a field lens oriented to receive focused light energy from the focusing lens group and provide intermediate light energy, a Mangin mirror arrangement positioned to receive the intermediate light energy from the field lens and form controlled light energy, and an immersion liquid between the Mangin mirror arrangement and the specimen.

According to a second aspect of the present invention, there is provided an objective employed for use in inspecting a specimen. The objective comprises a focusing lens group configured to receive light energy and comprising at least one focusing lens, and at least one field lens oriented to receive focused light energy from the focusing lens group and provide intermediate light energy, a Mangin mirror arrangement positioned to receive the intermediate light energy from the field lens and form controlled light energy, and an immersion substance located between the Mangin mirror arrangement and the specimen. The Mangin mirror arrangement imparts the controlled light energy to the specimen with a numerical aperture in excess of 0.9 and a field size of greater than or equal to approximately 0.15 mm.

According to a third aspect of the present invention, there is provided a method for inspecting a specimen. The method comprises providing light energy having a wavelength in the range of approximately 157 nanometers through the infrared light range, focusing the light energy using at least one lens into focused light energy, where each lens used in the focusing has diameter less than approximately 100 millimeters, receiving the focused light energy and converting the focused light energy into intermediate light energy, and receiving the intermediate light energy and providing controlled light energy through an immersion substance to a specimen.

According to a fourth aspect of the present invention, there is provided a variable focal length optical system for use in the presence of an objective having an objective exit pupil. The variable focal length optical system is employed in inspecting a specimen. The variable focal length optical system comprises a relatively fixed focusing lens group configured to receive the light energy from the exit pupil of the objective and comprising at least one focusing lens, and at least one movable imaging lens group oriented to receive focused light energy from the focusing lens group and provide an image. Each movable imaging lens group is capable of being repositioned relative to the relatively fixed focusing lens group, and separation between the relatively fixed focusing lens group and the exit pupil of the objective enables insertion of additional optical elements.

These and other objects and advantages of the present invention will become apparent to those skilled in the art from the following detailed description of the invention and the accompanying drawings.

DESCRIPTION OF THE DRAWINGS

The present invention is illustrated by way of example, and not by way of limitation, in the figures of the accompanying drawings in which.

DETAILED DESCRIPTION OF THE INVENTION

Available Dry Imaging Designs

Figure 1:
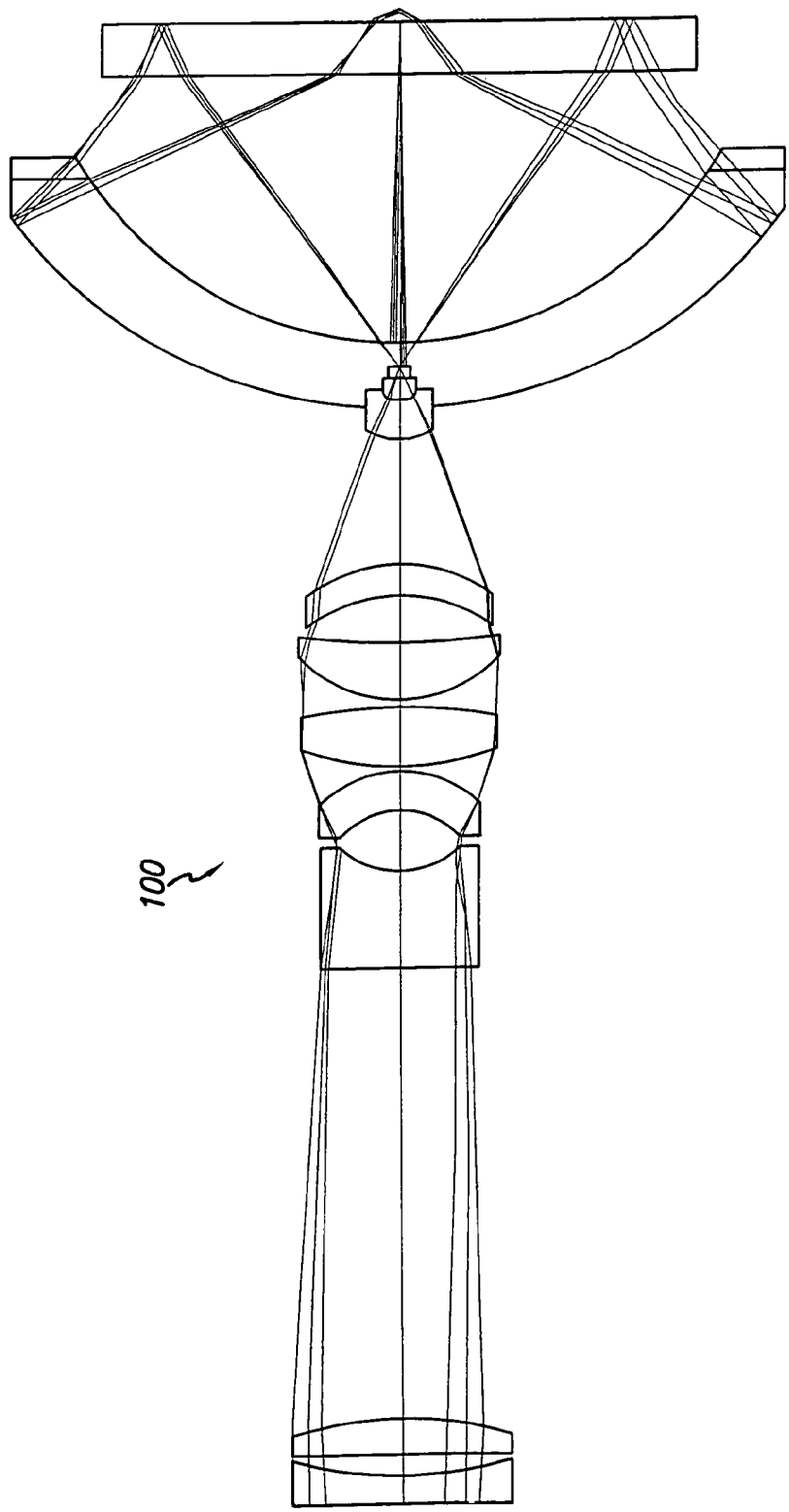
FIG. 1 illustrates an aspect of the catadioptric objective design similar to that presented in FIG. 1 of U.S. Pat. No. 5,717,518.

Two patents that disclose dry objective, broad band, highly UV corrected, high numerical aperture (NA) catadioptric systems are U.S. Pat. No. 5,717,518 to Shafer et al. and U.S. Pat. No. 6,483,638 to Shafer et al. Both represent dry imaging designs having certain advantageous inspection and imaging characteristics. A representative illustration of a catadioptric design 100 in accordance with the teachings of the '518 patent is presented in FIG. 1, which is similar to FIG. 1 of the '518 patent. A representative illustration of a catadioptric design 200 in accordance with the teachings of the '638 patent is presented in FIG. 2, which has similarities to FIG. 4 of the '638 patent.

U.S. Pat. No. 5,717,518 to Shafer et al. discloses a dry objective design capable of high NA, ultra broadband UV imaging. The high NA (up to approximately 0.9) system can be used for broadband bright field and multiple wavelength dark-field imaging. Certain issues exist with designs similar to that presented in FIG. 1. First, the field lens group may need to be physically located within a central hole in the large curved catadioptric element, which can make manufacturing difficult and expensive. Second, the field lens elements in such a design may require at least one glued interface. In the presence of wavelengths less then 365 nm, reliable glues that can withstand light intensity levels at an internal focus are generally unavailable. Third, the lens elements in such a design may be located very close to a field plane, thereby requiring a high degree of, or nearly perfect, surface quality and bulk material quality to prevent image degradation. Fourth, element diameters are typically larger than a standard microscope objective, especially for the catadioptric group. Large diameter elements prevent integration into a standard microscope system.

Figure 2:
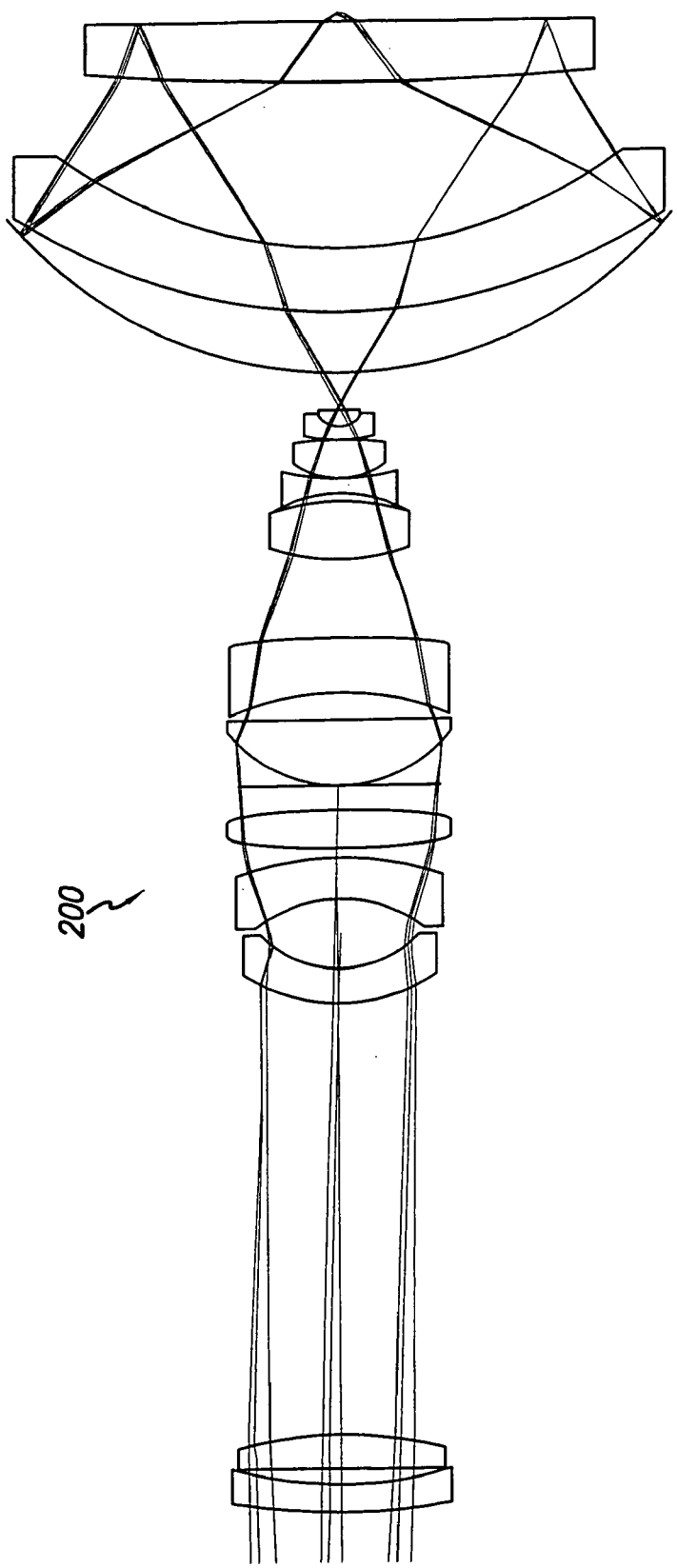
FIG. 2 is an aspect of the catadioptric objective design similar to that presented in FIG. 4 of U.S. Pat. No. 6,483,638.

The dry objective design of FIG. 2 is generally capable of high NA, ultra broadband UV imaging. The design is a high NA (up to approximately 0.9) imaging system that can be used for broadband bright field and multiple wavelength dark-field imaging and can use a varifocal tube lens to provide a large range of magnifications. The FIG. 2 design introduces very tight tolerances in the field lens group, due in part to increased on-axis spherical aberration produced by the catadioptric group. This on-axis spherical aberration must be corrected by the following refractive lens elements. The design of FIG. 2 is relatively large, thereby generally requiring complicated optomechanical mounting of elements, especially in the catadioptric group.

With respect to NA, the NA of an objective represents the objective's ability to collect light and resolve fine specimen detail at a fixed object distance. Numerical aperture is measured as the sine of the vertex angle of the largest cone of meridional rays that can enter or leave the optical system or element, multiplied by the refractive index of the medium in which the vertex of the cone is located. A large numerical aperture provides distinct advantages during inspection, not the least of which is an ability to resolve smaller features of the specimen. Also, high NAs collect a larger scattering angle, thereby improving performance in darkfield environments. For this reason, immersion objectives with high NAs are very desirable, and it is typically beneficial to specify the immersion substance refractive index when determining the operating NA of the objective. Changing the immersion substance to one having a higher refractive index will proportionally increase the NA.

An objective that can cover as large a range of wavelengths as possible is also desirable in certain scenarios, particularly when using an arc lamp as an illumination source. Currently available immersion designs are all refractive, and refractive designs tend to limit wavelength range because few glass materials having high transmission below 400 nm are effective for chromatic correction.

Figure 13:
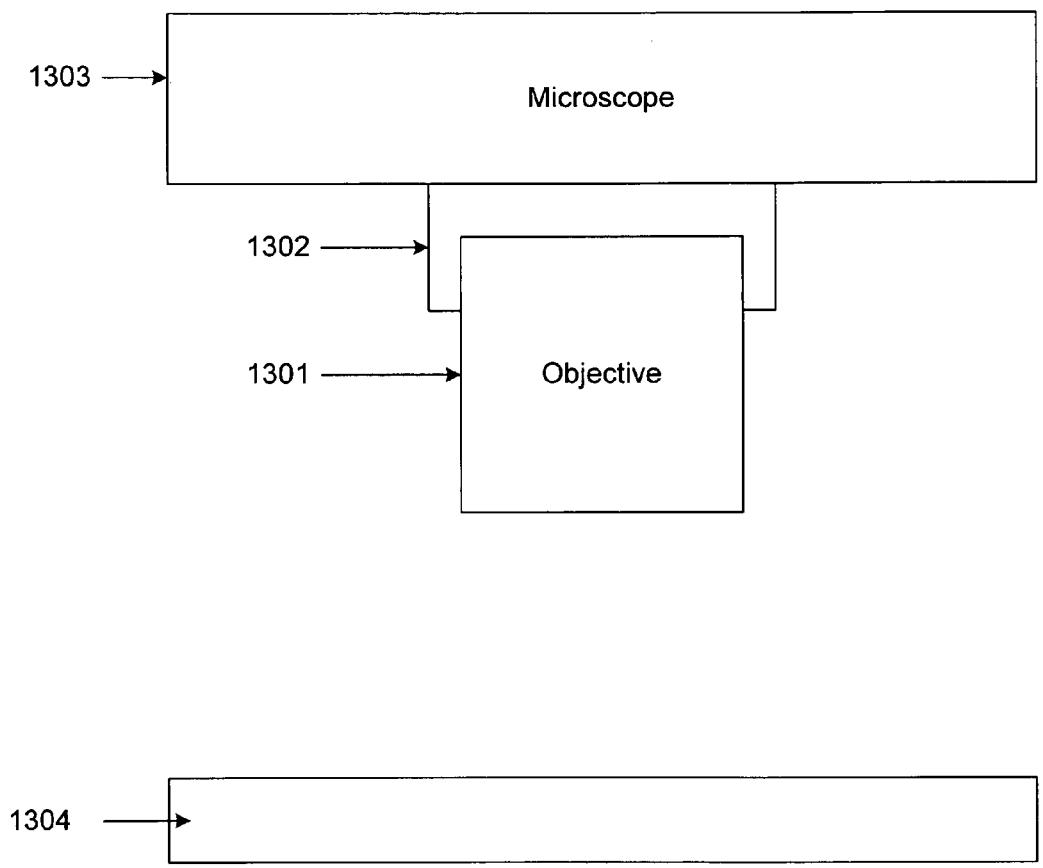
FIG. 13 conceptually represents use of an objective in a flange in a microscope.

Small objectives are also desirable, as small objectives can be used in combination with standard microscope objectives and physically fit within standard microscope turrets. The standard objective flange-to-object distance is in the range of 45 mm. A conceptual drawing (not to scale) of an objective 1301, a flange 1302, and a microscope 1303 is illustrated in FIG. 13, where the flange in the aforementioned situation is approximately 45 mm from specimen 1304. The available catadioptric objectives frequently cannot satisfy this requirement, so special microscope systems can be employed having an objective flange-to-object distance in excess of 60 mm and having lens diameters greater than 60 mm.

An objective having low intrinsic aberrations is also desirable, as is an objective that is largely self-corrected for both monochromatic and chromatic aberrations. A self corrected objective will have looser alignment tolerances with other self corrected imaging optics. An objective with loose manufacturing tolerances, such as lens centering tolerances, may be particularly beneficial. Further, reducing incidence angles on lens surfaces can have a large effect on optical coating performance and manufacturing. In general, lower angles of incidence on lens surfaces also produce looser manufacturing tolerances.

Immersion Imaging Designs

Figure 3:
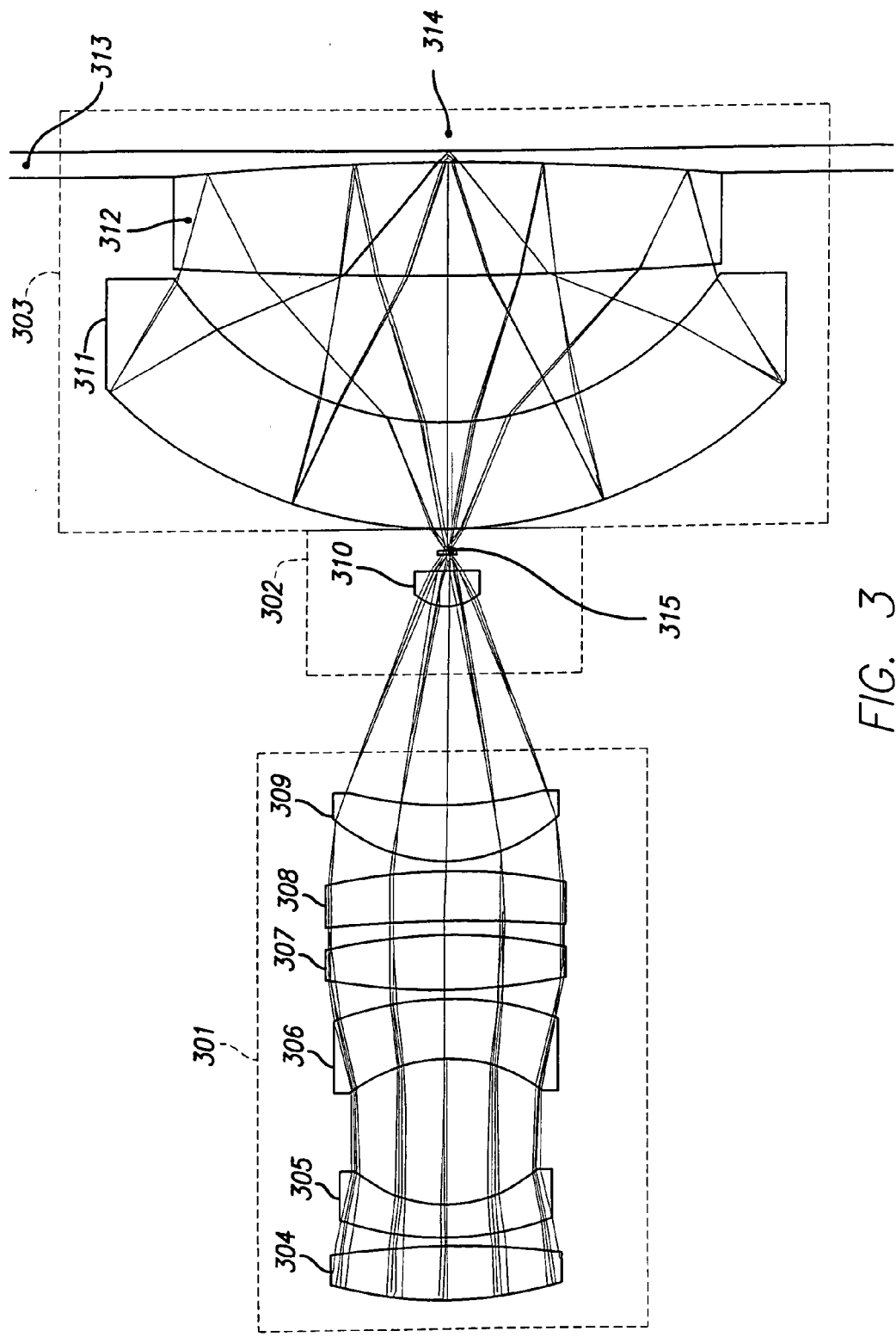
FIG. 3 presents a nine element reduced size catadioptric immersion objective with a 0.95 NA in accordance with the present design, corrected over a bandwidth from 266 to 436 nm and having a field size of approximately 0.150 mm.

The present design presents a catadioptric immersion objective corrected over a wide wavelength range using a single glass material, or in certain circumstances, more than one glass material to improve performance. The objective employed herein may provide particular benefits in the microscopy field. One aspect of the objective design is shown in FIG. 3. The catadioptric objective as shown in FIG. 3 is optimized for broad-band imaging in the UV and visible spectral region, namely approximately 0.266 to 0.436 micron wavelengths. The objective provides high numerical apertures of 0.95 assuming pure water is used as an immersion substance. Other immersion substances could be used with higher indices to further increase the NA. The inventive design presented uses the Schupmann principle in combination with an Offner field lens to correct for axial color and first order lateral color. As shown in the aspect presented in FIG. 3, the field lens group 302 is slightly displaced from the intermediate image 315 to obtain enhanced performance, and the design employs liquid as shown by immersion liquid layer 313.

As used herein, the terms "immersion liquid," "immersion substance," or "immersion liquid layer" refer to any non-solid non-gaseous substance, including but not limited to liquid or other viscous material, as particularly differentiated from gasses or gaseous materials. Immersion liquids that may be employed in the current design include, but are not limited to, water, oil, silicone gel, or other liquid, semi-liquid, viscous, or partially viscous substances. While solid, gaseous, or other materials may be included within the "immersion liquid" or "immersion substance," as used herein, these materials comprise primarily liquid, semi-liquid, viscous, or partially viscous substances. These terms will be used throughout this discussion primarily using the term "immersion liquid," but use of the other terms such as immersion substance or immersion liquid layer indicates materials conforming to the definition presented herein.

From FIG. 3, the catadioptric group 303 or Mangin mirror arrangement includes a Mangin mirror element 312. Mangin mirror element 312 is a reflectively coated lens element. The catadioptric group 303 also includes concave spherical reflector 311, also a reflectively coated lens element. Both elements in the catadioptric group 303 have central optical apertures where reflective material is absent. The absence of reflective material allows light to pass from the object or specimen 314 through the immersion liquid 313 to Mangin mirror element 312, reflect from the second or outer surface of concave spherical reflector 311, onto the reflective surface of Mangin mirror element 312, and through concave spherical reflector 311 to form an intermediate image 315 after concave spherical reflector 311. The field lens group 302 may comprise one or more lenses, and in the aspect shown in FIG. 3, one field lens 310 is employed.

The focusing lens group 301 uses multiple lens elements, in the aspect shown six lens elements 304, 305, 306, 307, 308, and 309. All lenses in the focusing lens group 301 may be formed from a single type of material to collect the light from the field lens group 302 and the intermediate image 315.

The lens prescription for the aspect of the invention illustrated in FIG. 3 is presented in Table 1.

TABLE 1

Prescription for lenses for the design of FIG. 3

| Surf | Radius | Thickness | Glass | Diameter |
|---|---|---|---|---|
| OBJ | Infinity | Infinity | | 0.00 |
| 1 | Infinity | 18.0000 | | 9.10 |
| STO | Infinity | −18.0000 | | 8.50 |
| 3 | 17.6779 | 2.0000 | Fused Silica | 9.08 |
| 4 | −44.7675 | 0.5000 | | 8.85 |
| 5 | 13.6362 | 1.2500 | Fused Silica | 8.33 |
| 6 | 5.9607 | 5.6987 | | 7.45 |
| 7 | −6.5395 | 2.3911 | Fused Silica | 7.54 |
| 8 | −12.2563 | 0.5000 | | 8.78 |
| 9 | 29.8365 | 2.0000 | Fused Silica | 9.28 |
| 10 | −21.5455 | 0.5000 | | 9.40 |
| 11 | −101.8361 | 2.0000 | Fused Silica | 9.34 |
| 12 | −24.8901 | 0.5000 | | 9.32 |
| 13 | 6.7391 | 2.2500 | Fused Silica | 8.81 |
| 14 | 22.9759 | 7.8495 | | 8.19 |
| 15 | 1.9529 | 1.2495 | Fused Silica | 2.50 |
| 16 | 6.1579 | 0.7828 | | 1.66 |
| 17 | Infinity | 0.9995 | | 0.00 |
| 18 | 18.1935 | 4.1697 | Fused Silica | 26.20 |
| 19 | 12.8633 | 5.7334 | | 21.20 |
| 20 | 183.2127 | 4.4199 | Fused Silica | 21.20 |

TABLE 1-continued

Prescription for lenses for the design of FIG. 3

| Surf | Radius | Thickness | Glass | Diameter |
|---|---|---|---|---|
| 21 | −91.4932 | −4.4199 | MIRROR | 21.20 |
| 22 | 183.2127 | −5.7334 |  | 21.20 |
| 23 | 12.8633 | −4.1697 | Fused Silica | 21.20 |
| 24 | 18.1935 | 4.1697 | MIRROR | 26.20 |
| 25 | 12.8633 | 5.7334 |  | 21.20 |
| 26 | 183.2127 | 4.4199 | Fused Silica | 0.00 |
| 27 | −91.4932 | 0.4862 | Fused Silica | 0.00 |
| IMA | Infinity |  | Fused Silica | 40.00 |

As may be appreciated by one skilled in the art, the numbers in the leftmost column of Table 1 represent the surface number counting surfaces from the left of FIG. 3. For example, the left surface of lens 304 in the orientation presented in FIG. 3 (surface 3 in Table 1) has a radius of curvature of 17.6779 mm, a thickness of 2.0 mm, and the rightmost surface (surface 4) has a radius of curvature of −44.7675 mm, and is 0.5 mm from the next surface. The material used is fused silica, and surface 3 has a diameter of 9.08 mm while surface 4 has a diameter of 8.85 mm.

In the design presented in FIG. 3, the numerical aperture may approach or even exceed approximately 0.95 in water. From FIG. 3, the focusing lens group 301 has the ability to receive light energy and transmit focused light energy. The field lens group 302 has the ability to receive the focused light energy and provide intermediate light energy, and form intermediate image 315. The catadioptric group or Mangin mirror arrangement 303 receives the intermediate energy and provides controlled light energy to the specimen. Alternately, the reflected path originates at the specimen, and light reflected from the specimen is received by the catadioptric group or Mangin mirror arrangement 303 and forms and transmits reflected light energy. The field lens group 302 receives the reflected light energy and transmitting resultant light energy, and the focusing lens group receives resultant light energy and transmits focused resultant light energy. An aperture or mask can be placed at the aperture stop (not shown) to limit or modify the NA of the objective.

The design presented in FIG. 3 and Table 1 thus uses a single glass material, fused silica. Other materials may be employed, but it is noted that fused silica or any material used within the design may require low absorption over the range of wavelengths supported by the objective design. Fused silica offers relatively high transmission properties for light energy from 190 nm through the infrared wavelengths. Because of the single material design of the immersion objective, fused silica can enable the design to be re-optimized for any center wavelength in this wavelength range. For example, the design can be optimized for use with lasers at 193, 198.5, 213, 244, 248, 257, 266, 308, 325, 351, 355, or 364 nm. The design can also be optimally employed to cover lamp spectral bands from 190-202, 210-220, 230-254, 285-320, and 365-546 nm. In addition, if calcium fluoride is employed as a glass or lens material, the design can be employed with an excimer laser at 157 nm or excimer lamps at 157 or 177 nm. Reoptimization requires slight tuning or altering of components, and may generally be within the abilities of those skilled in the art. Calcium fluoride lenses may also be employed in the field lens group to increase the bandwidth of the objective.

The maximum diameter of a lens element is 26 millimeters, which is significantly smaller than many objective designs previously employed in this wavelength range. The small size of this objective is particularly beneficial in view of the performance characteristics of the objective. As a result, the objective can be mounted in a standard microscope turret with an approximate 45 mm flange-to-object separation. This immersion objective supports a numerical aperture of approximately 0.95, a field size of approximately 0.15 mm, has a corrected bandwidth from approximately 266-436 nm, and a polychromatic wavefront error of less than approximately 0.05 waves, levels which had been previously unachievable in combination in a single design. Field size in this arrangement represents the size of the area on the specimen that can be imaged the system with minimum degradation in optical performance.

As is true with any optical design, certain tradeoffs may be made to improve performance characteristics depending on the desired application of the objective or optical design. It is possible, for example, to sacrifice bandwidth, field size, numerical aperture, and/or objective size to enhance one of the aforementioned performance characteristics, depending on the application. For example, optimizing for lower or higher NAs is possible. Reducing the NA can reduce the manufacturing tolerance and the outer diameter of the objective. Lower NA designs can provide larger field sizes and larger bandwidths. Lower NA designs with the same performance and less optical elements are also possible. Optimizing for higher NAs is also possible. Optimizing the design for higher NAs would generally limit the field size or bandwidth and may require slightly increased diameter objective elements.

The design of FIG. 3 provides a relatively low intrinsic polychromatic wavefront aberration over the design bandwidth from approximately 266-436 nm. The low wavefront aberration provides increased manufacturing headroom, or ease of manufacture, while enabling relatively high performance of the manufactured objective. The design is also self corrected, where self corrected in this context means that the objective does not require any additional optical components to correct aberrations in order to achieve inspection design specifications. In other words, no additional components are needed to provide a generally aberration free image, or the objective provides substantially complete images without need for additional compensation. The ability to self correct can provide for simpler optical testing metrology and optical alignment to other self corrected imaging optics. Further correction of residual aberrations using additional imaging optics is also possible, where further correction can increase the optical specifications, including but not limited to bandwidth or field size.

The design of FIG. 3 has relatively loose tolerances on the refractive index of the glass material, largely due to use of a single material that does not rely on the refractive index difference of two different glass materials to compensate for chromatic aberrations. Use of a single material also makes the design very insensitive to temperature changes. Previous designs have used multiple glass materials with different refractive index profiles for color correction. The result is the refractive index profile for each material changing differently with temperature, thereby changing the chromatic correction for temperatures other than the design temperature and reduced overall performance.

The immersion objective design presented herein can support various modes of illumination and imaging. Modes supported can include bright field and a variety of dark field illumination and imaging modes. Other modes such as confocal, differential interference contrast, polarization contrast may also be supported using the present design.

Bright field mode is commonly used in microscope systems. The advantage of bright field illumination is the clarity of the image produced. Using bright field illumination with an objective such as that presented herein provides a relatively accurate representation of object feature size multiplied by the magnification of the optical system. The objective and optical components presented herein can be readily used with image comparison and processing algorithms for computerized object detection and classification. Bright field mode typically uses a broad band incoherent light source, but it may be possible to use laser illumination sources with slightly modified illumination system components and employing the objective design presented herein.

The confocal mode has been used for optical sectioning to resolve height differences of object features. Most imaging modes have difficulty detecting changes in the height of features. The confocal mode forms separate images of object features at each height of interest. Comparison of the images then shows the relative heights of different features. Confocal mode may be employed using the design presented herein.

Dark field mode has been used to detect features on objects. The advantage of the dark field mode is that flat specular areas scatter very little light toward the detector, resulting in a dark image. Surface features or objects protruding above the object tend to scatter light toward the detector. Thus, in inspecting objects like semiconductor wafers, dark field imaging produces an image of features, particles, or other irregularities on a dark background. The present design may be employed with dark field mode illumination. Dark field mode provides a large resultant signal upon striking small features that scatter light. This large resultant signal allows larger pixels to be employed for a given feature size, permitting faster object inspections. Fourier filtering can also be used to minimize the repeating pattern signal and enhance the defect signal to noise ratio during dark field inspection.

Many different dark field modes exist, each including a specific illumination and collection scheme. Illumination and collection schemes can be chosen such that the scattered and diffracted light collected from the object provides an acceptable signal-to-noise ratio. Certain optical systems use different dark field imaging modes including ring dark field, laser directional dark field, double dark field, and central dark ground. Each of these dark field imaging modes may be employed in the present design.

Any of the above mentioned imaging modes may be efficiently employed with the immersion imaging design of FIG. 3, albeit where slight modifications to certain components may offer improvements to certain performance parameters. In any configuration, the immersion imaging objective design presented enables inspection in any of the named imaging modes with the result of a relatively high numerical aperture, operation over a broad wavelength spectrum, with relatively high field size. The design can operate within a standard microscope turret and offers imaging performance better than that previously known.

Figure 4:
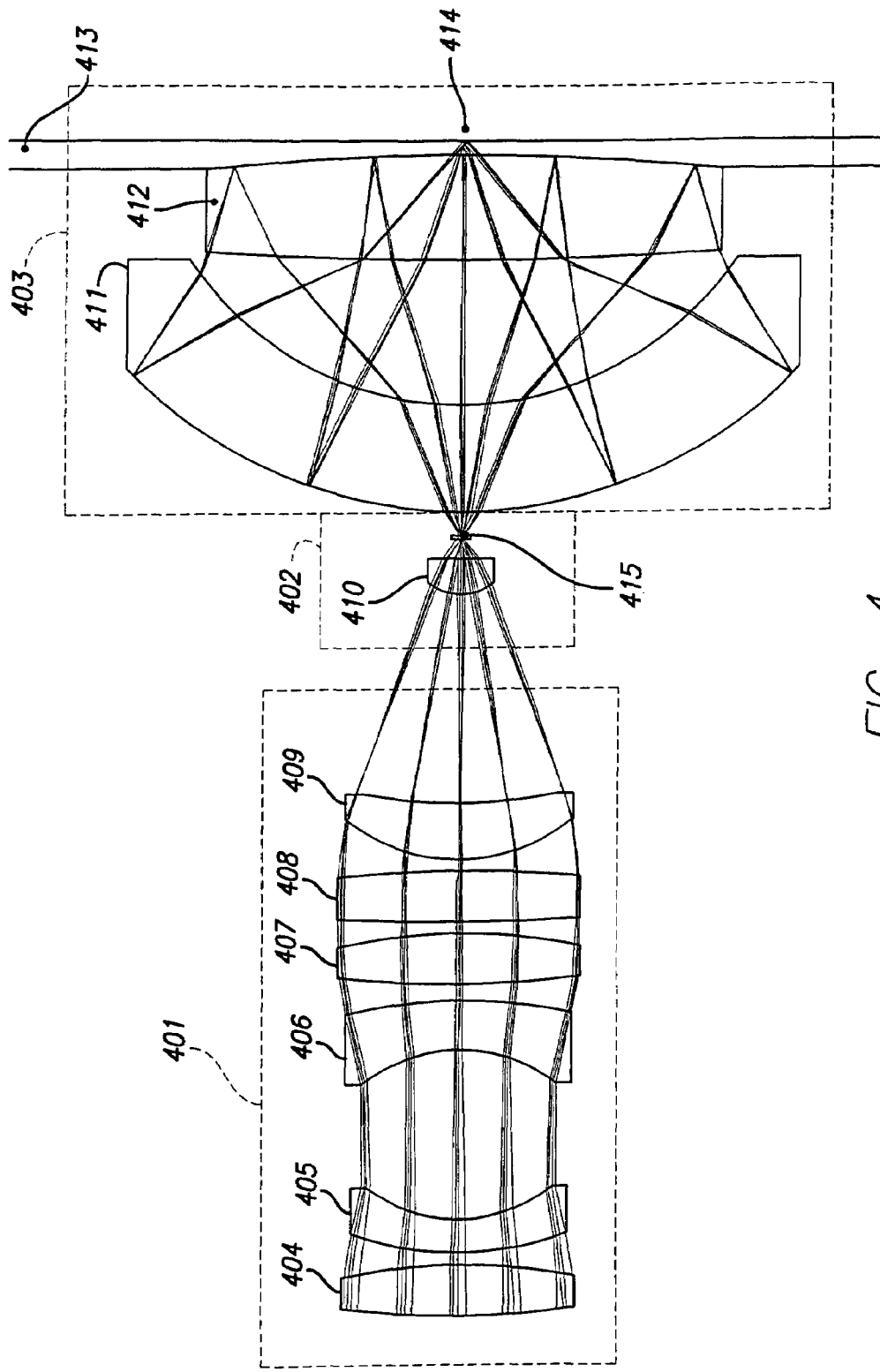
FIG. 4 is a broad band reduced size catadioptric immersion objective with a 1.0 NA in accordance with the present immersion imaging design, corrected over a bandwidth from 266 to 436 nm and having a field size of approximately 0.150 mm.

An alternate aspect of the present design presents an immersion objective with nine separate elements. This aspect of the design is presented in FIG. 4. The differences between the design of FIG. 4 and that of FIG. 3 are the reoptimization to correct for the refractive index and dispersion of water used as the immersion fluid. The design of FIG. 4 also increases the NA of the objective to approximately 1.0 assuming pure water is used as an immersion substance. Other immersion substances could be used with higher refractive indices to further increase the NA. The objective of the design of FIG. 4 is corrected over a bandwidth from approximately 266 to 436 nm has a field size of approximately 0.150 mm. The worst case polychromatic wavefront error for the FIG. 4 design is approximately 0.05 waves.

From FIG. 4, the catadioptric group 403 includes a Mangin mirror element 412, which is a reflectively coated lens element, and a concave spherical reflector 411, which is also a reflectively coated lens element. Both Mangin mirror element 412 and concave spherical reflector 411 have central optical apertures where reflective material is absent. The absence of reflective material, in the center of the components shown, allows light to pass from the object or specimen 414, through the immersion liquid 413, and Mangin mirror element 412, reflect from the second surface of concave spherical reflector 411 onto the Mangin mirror element 412, and transmit through concave spherical reflector 411 to form an intermediate image 415 after concave spherical reflector 411. Field lens group 402 comprises a single field lens 410 in this aspect of the design.

The focusing lens group 401 employs multiple lens elements, in this aspect the six lens elements 404, 405, 406, 407, 408, and 409, which may all be formed from a single type of material. The focusing lens group 401 collects light from the field lens group 402, including the intermediate image 415. An aperture or mask can be placed at the aperture stop (not shown) to limit or modify the NA of the objective. The design presented in FIG. 4 has virtually all of the advantages and flexibility described with respect to the design of FIG. 3. The lens prescription for this embodiment is shown in Table 2.

TABLE 2

Prescription for lenses for the design of FIG. 4

| Surf | Radius | Thickness | Glass | Diameter |
|---|---|---|---|---|
| OBJ | Infinity | Infinity | | 0.00 |
| 1 | Infinity | 19.0000 | | 9.13 |
| STO | Infinity | −19.0000 | | 8.50 |
| 3 | 28.5196 | 2.0000 | Fused silica | 9.12 |
| 4 | −33.6705 | 0.5000 | | 8.95 |
| 5 | 12.9081 | 1.2500 | Fused silica | 8.48 |
| 6 | 6.5008 | 6.6131 | | 7.70 |
| 7 | −6.9274 | 2.1444 | Fused silica | 7.76 |
| 8 | −14.7698 | 0.5000 | | 8.88 |
| 9 | 35.7354 | 2.0000 | Fused silica | 9.37 |
| 10 | −22.7923 | 0.5000 | | 9.53 |
| 11 | 88.0026 | 2.0000 | Fused silica | 9.52 |
| 12 | −32.4362 | 0.5000 | | 9.47 |
| 13 | 7.2825 | 2.2500 | Fused silica | 9.01 |
| 14 | 28.2840 | 8.3107 | | 8.41 |
| 15 | 2.0231 | 1.2495 | Fused silica | 2.60 |
| 16 | 7.4344 | 0.8873 | | 1.80 |
| 17 | Infinity | 0.9995 | | 0.63 |
| 18 | 17.7330 | 4.1250 | Fused silica | 26.00 |
| 19 | 12.4735 | 5.6276 | | 21.00 |
| 20 | 127.4223 | 4.1943 | Fused silica | 20.00 |
| 21 | −105.0674 | −4.1943 | MIRROR | 20.00 |
| 22 | 127.4223 | −5.6276 | | 20.00 |
| 23 | 12.4735 | −4.1250 | Fused silica | 21.00 |
| 24 | 17.7330 | 4.1250 | MIRROR | 26.00 |
| 25 | 12.4735 | 5.6276 | | 21.00 |
| 26 | 127.4223 | 4.1943 | Fused silica | 20.00 |
| 27 | −105.0674 | 0.6026 | WATER | 20.00 |
| IMA | Infinity | | WATER | 20.00 |

Figure 5:
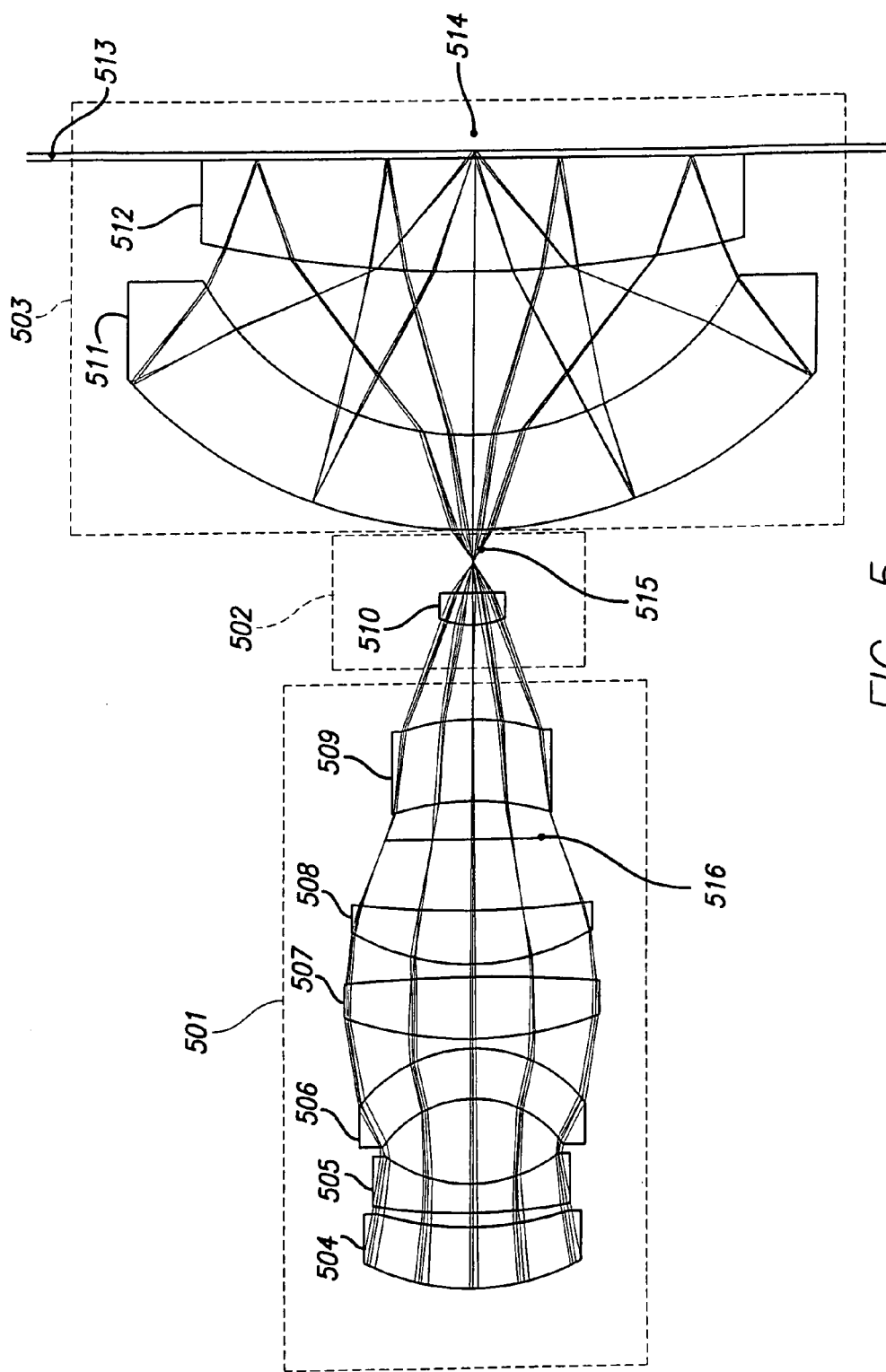
FIG. 5 illustrates a nine element reduced size catadioptric immersion objective with a 1.0 NA in accordance with the present design, corrected over a bandwidth from 190 to 196 nm and having a field size of approximately 0.150 mm.

An alternate aspect of the present design presents an immersion objective again having nine elements. This aspect of the design is presented in FIG. 5. The main difference between the design of FIG. 5 and that of FIG. 3 is the redesign for a shorter wavelength while maintaining a relatively high 1.0 numerical aperture assuming pure water is used as an immersion substance. Other immersion substances could be used with higher refractive indices to further increase the NA. The objective of the design of FIG. 5 is corrected over a bandwidth from approximately 190 to 196 nm and has a field size of approximately 0.150 mm. The worst case polychromatic wavefront error for the FIG. 5 design is approximately 0.04 waves.

From FIG. 5, the catadioptric group 503 includes a Mangin mirror element 512, again a reflectively coated lens element, and a concave spherical reflector 511, which is also a reflectively coated lens element. Both Mangin mirror element 512 and concave spherical reflector 511 have central optical apertures where reflective material is absent. The absence of reflective material, in the center of the components shown, allows light to pass from the object or specimen 514 through the immersion fluid 513 to Mangin mirror element 512, reflect from the second surface of concave spherical reflector 511 onto the Mangin mirror element 512, and transmit through concave spherical reflector 511 to form an intermediate image 515 after concave spherical reflector 511. The field lens group 502 comprises a single field lens 510 in this aspect of the design.

The focusing lens group 501 employs multiple lens elements, in this aspect the six lens elements 504, 505, 506, 507, 508, and 509, which may all be formed from a single type of material. The focusing lens group 501 collects light from the field lens group 502, including the intermediate image 515. An aperture or mask can be placed at this aperture stop 516 to limit or modify the NA of the objective. The design presented in FIG. 5 generally offers the same advantages and flexibility described with respect to the design of FIG. 3. The lens prescription for this embodiment is shown in Table 3.

TABLE 3

Prescription for lenses for the design of FIG. 5

| Surf | Radius | Thickness | Glass | Diameter |
|---|---|---|---|---|
| OBJ | Infinity | Infinity | | 0.0 |
| 1 | Infinity | 14.0000 | | 9.0 |
| STO | Infinity | −14.0000 | | 8.5 |
| 3 | 9.8113 | 2.5000 | Fused silica | 8.9 |
| 4 | 16.0993 | 0.5000 | | 8.2 |
| 5 | 24.5090 | 1.2500 | Fused silica | 8.1 |
| 6 | 6.4363 | 3.5000 | | 7.5 |
| 7 | −4.6748 | 2.1162 | Fused silica | 7.6 |
| 8 | −5.7355 | 0.5000 | | 9.3 |
| 9 | 15.5382 | 2.5000 | Fused silica | 10.5 |
| 10 | −48.2247 | 0.5000 | | 10.4 |
| 11 | 9.5400 | 2.2500 | Fused silica | 9.9 |
| 12 | 39.5324 | 3.0432 | | 9.3 |
| 13 | Infinity | 1.5000 | | 7.2 |
| 14 | −12.0978 | 3.3227 | Fused silica | 6.5 |
| 15 | −10.1308 | 3.9848 | | 5.9 |
| 16 | 4.1943 | 1.2500 | Fused silica | 2.6 |
| 17 | −74.2314 | 2.5000 | | 1.9 |
| 18 | Infinity | 0.0000 | | 1.7 |
| 19 | 18.2106 | 4.0512 | Fused silica | 1.7 |
| 20 | 12.5801 | 6.7677 | | 4.4 |
| 21 | 53.8539 | 4.7121 | Fused silica | 15.0 |
| 22 | Infinity | −4.7121 | MIRROR | 17.8 |
| 23 | 53.8539 | −6.7677 | | 20.4 |
| 24 | 12.5801 | −4.0512 | Fused silica | 21.7 |
| 25 | 18.2106 | 4.0512 | MIRROR | 27.7 |
| 26 | 12.5801 | 6.7677 | | 19.4 |
| 27 | 53.8539 | 4.7121 | Fused silica | 8.1 |
| 28 | Infinity | 0.3000 | Immersion fluid | 0.6 |
| IMA | Infinity | | Immersion fluid | 0.2 |

Figure 6:
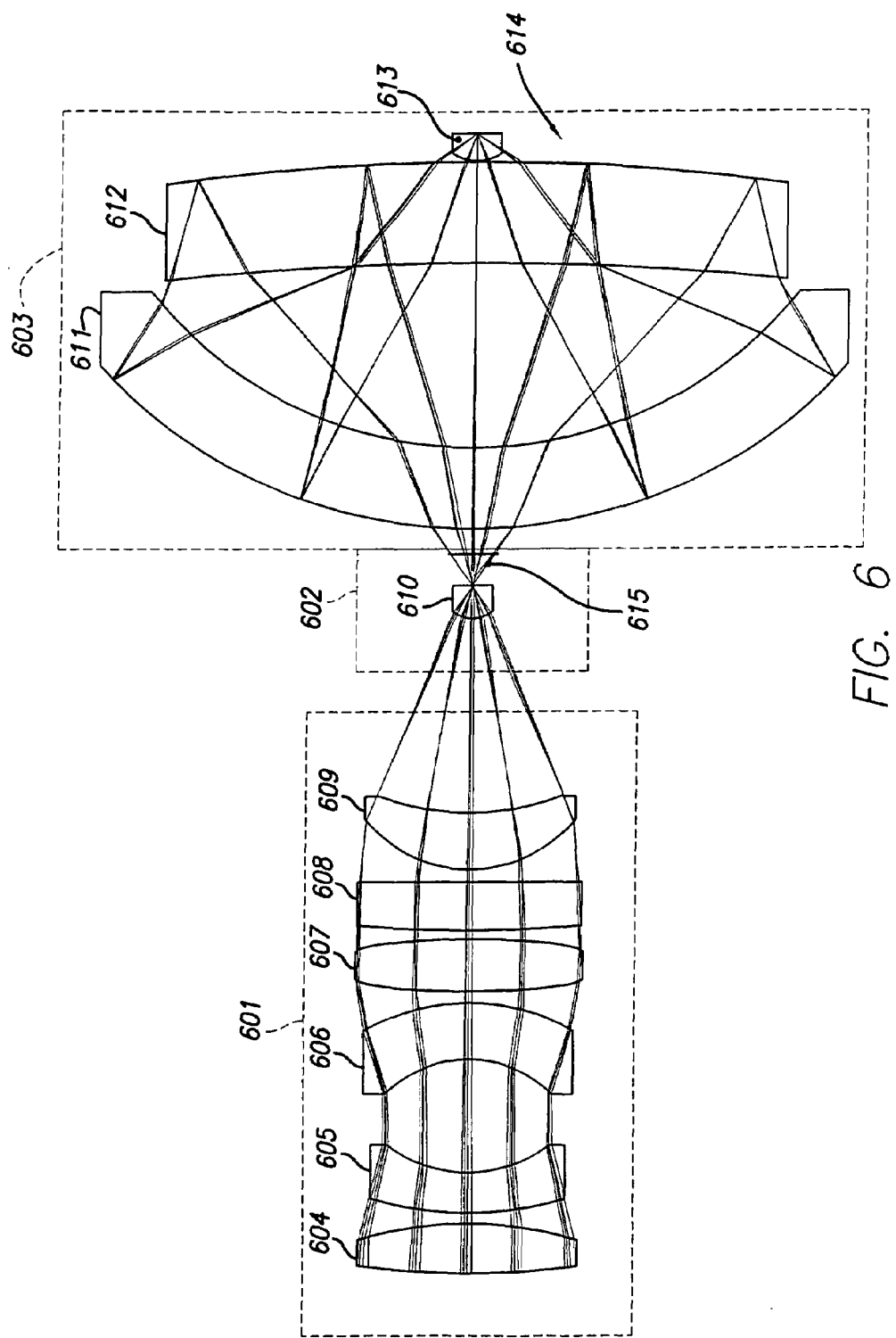
FIG. 6 presents a ten element reduced size catadioptric immersion objective with a 1.2 NA in accordance with the present design, corrected over a bandwidth from 190 to 196 nm and a substantially flat immersion surface.

Another aspect of the design presents an immersion objective having ten elements. This aspect of the design is presented in FIG. 6. One difference between the design of FIG. 6 and that of FIG. 4 is the addition of a small immersion lens in front of the catadioptric group. The immersion liquid 614 is located to the right of lens 613. The objective of the design of FIG. 6 is corrected over a bandwidth from between approximately 266 to 436 nm, and has a field size of approximately 0.075 mm. The design of FIG. 6 again provides a relatively high approximately 1.2 numerical aperture assuming pure water is used as an immersion substance. Again, other immersion substances could be used with higher refractive indices to further increase the NA. Worst case polychromatic wavefront error for the FIG. 6 design is approximately 0.045 waves.

From FIG. 6, the catadioptric group 603 includes an immersion lens 613, Mangin mirror element 612, which is a reflectively coated lens element, and a concave spherical reflector 611, also a reflectively coated lens element. Both Mangin mirror element 612 and concave spherical reflector 611 have central optical apertures where reflective material is absent. The absence of reflective material from the center of these components allows light to pass from the object and immersion liquid 614, through immersion lens 613, through Mangin mirror element 612, reflect from the second surface of concave spherical reflector 611 onto the Mangin mirror element 612, and transmit through concave spherical reflector 611 to form an intermediate image 615 after concave spherical reflector 611. Field lens group 602 comprises a single field lens 610 in this aspect of the design. Note that borders for immersion liquid 614 are not specifically shown in this view; it is understood that immersion liquid 614 contacts immersion lens 613 and may be disposed adjacent to the surface of the specimen, not shown in this view.

The focusing lens group 601 employs multiple lens elements, in this aspect the six lens elements 604, 605, 606, 607, 608, and 609, which may all be formed from a single type of material. The focusing lens group 601 collects light from the field lens group 602, including the intermediate image 615. An aperture or mask can be placed at the aperture stop (not shown) to limit or modify the NA of the objective.

The lens prescription for this embodiment is shown in Table 4.

TABLE 4

Prescription for lenses for the design of FIG. 6

| Surf | Radius | Thickness | Glass | Diameter |
|---|---|---|---|---|
| OBJ | Infinity | Infinity | | 0.0 |
| 1 | Infinity | 21.0000 | | 8.9 |
| STO | Infinity | −21.0000 | | 8.5 |
| 3 | 33.3993 | 2.0000 | Fused silica | 8.9 |
| 4 | −15.0280 | 0.5000 | | 8.8 |
| 5 | 14.6458 | 1.5000 | Fused silica | 8.0 |
| 6 | 5.6019 | 4.7962 | | 7.0 |
| 7 | −5.0202 | 2.4398 | Fused silica | 6.9 |
| 8 | −9.5561 | 0.5000 | | 8.4 |
| 9 | 31.6324 | 2.0000 | Fused silica | 9.0 |
| 10 | −19.8335 | 0.5000 | | 9.2 |
| 11 | 36.6869 | 2.0000 | Fused silica | 9.2 |
| 12 | −312.7053 | 0.5000 | | 9.0 |
| 13 | 5.5701 | 2.2500 | Fused silica | 8.6 |
| 14 | 13.6079 | 8.0205 | | 8.0 |
| 15 | 1.3437 | 1.2495 | Fused silica | 1.7 |
| 16 | 2.2515 | 1.4000 | | 0.7 |
| 17 | Infinity | 0.9995 | | 2.0 |
| 18 | 20.3068 | 3.3979 | Fused silica | 30.0 |
| 19 | 16.7118 | 7.3529 | | 26.0 |

TABLE 4-continued

Prescription for lenses for the design of FIG. 6

| Surf | Radius | Thickness | Glass | Diameter |
|---|---|---|---|---|
| 20 | −123.1263 | 4.1188 | Fused silica | 25.0 |
| 21 | −84.9933 | −4.1188 | MIRROR | 25.0 |
| 22 | −123.1263 | −7.3529 | | 25.0 |
| 23 | 16.7118 | −3.3979 | Fused silica | 26.0 |
| 24 | 20.3068 | 3.3979 | MIRROR | 30.0 |
| 25 | 16.7118 | 7.3529 | | 26.0 |
| 26 | −123.1263 | 4.1188 | Fused silica | 25.0 |
| 27 | −84.9933 | 0.1000 | | 25.0 |
| 28 | 1.7798 | 1.0000 | Fused silica | 2.0 |
| IMA | Infinity | | Immersion liquid | 0.1 |

Figure 7:
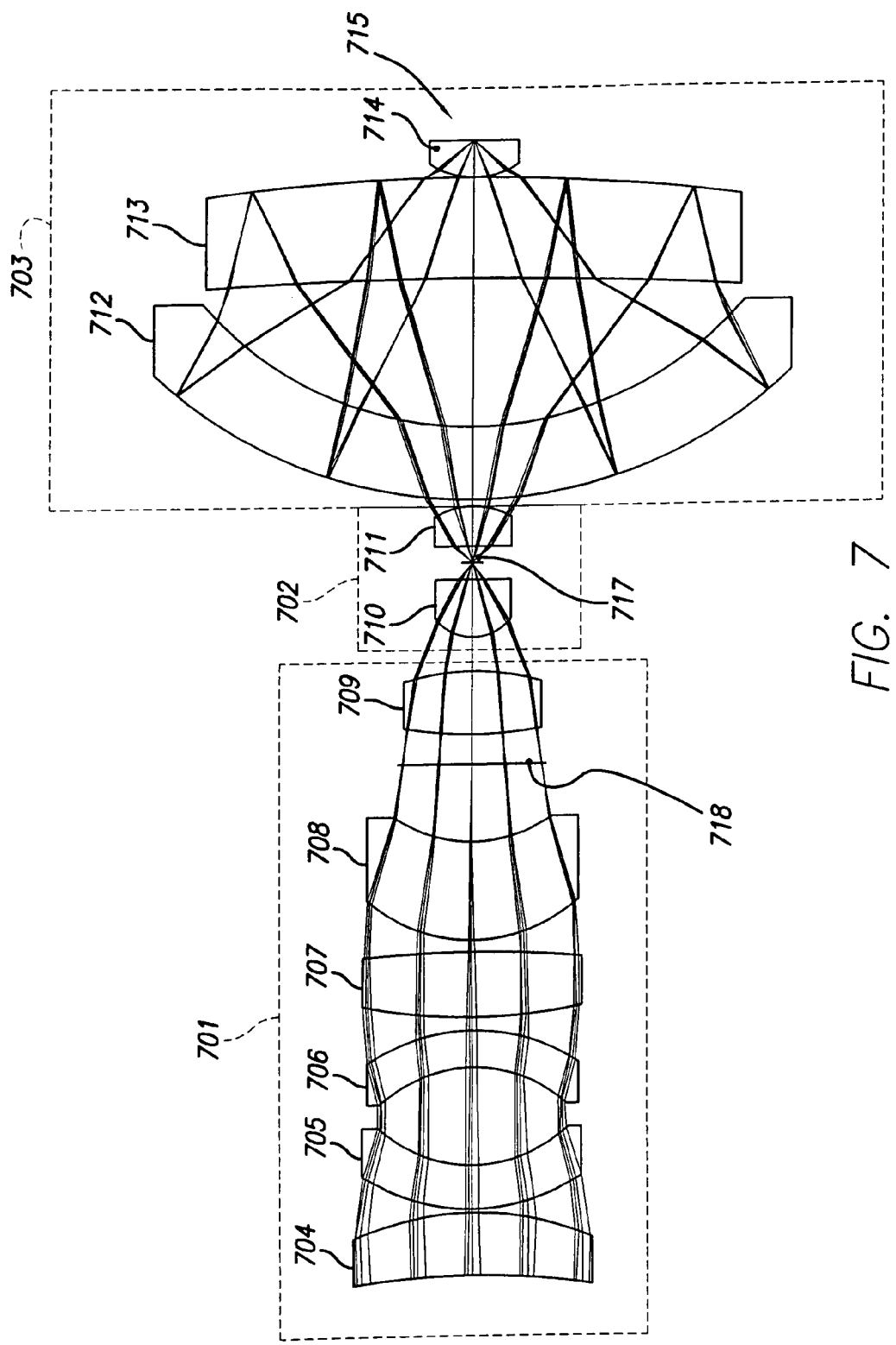
FIG. 7 illustrates an eleven element reduced size catadioptric immersion objective with a 1.1 NA in accordance with the present design, corrected over a bandwidth from 266 to 800 nm and having a field size of approximately 0.100 mm.

An alternate aspect of the present design presents an immersion objective with eleven separate elements. This aspect of the design is presented in FIG. 7. The difference between the design of FIG. 6 and that of FIG. 7 is the addition of a second field lens element, thus providing two field lens elements 710 and 711. The use of two field lens elements allows the immersion objective of the design of FIG. 7 to be corrected over a significantly wider bandwidth range, namely for bandwidths from approximately 266 to 800 nm. The objective of FIG. 7 provides a field size of approximately 0.100 mm and maintains the high approximately 1.1 numerical aperture assuming pure water is used as an immersion substance. Other immersion substances could be used with higher refractive indices to further increase the NA. The worst case polychromatic wavefront error for the FIG. 7 design is approximately 0.06 waves.

From FIG. 7, the catadioptric group 703 includes an immersion lens 714, Mangin mirror element 713, which is a reflectively coated lens element, and a concave spherical reflector 712, which is also a reflectively coated lens element. Both Mangin mirror element 713 and concave spherical reflector 712 have central optical apertures where reflective material is absent. The absence of reflective material, in the center of the components shown, allows light to pass from the specimen (not shown) through immersion liquid 715 and immersion lens 714, to Mangin mirror element 713, reflect from the second surface of concave spherical reflector 712 onto the Mangin mirror element 713, and transmit through concave spherical reflector 712 to form an intermediate image 717 after passing through concave spherical reflector 712 and field lens 711. Field lens group 702 comprises two field lenses 710 and 711 in this aspect of the design, and again, borders for the immersion liquid or immersion substance 715 are not illustrated in this view.

The focusing lens group 701 employs multiple lens elements, in this aspect the six lens elements 704, 705, 706, 707, 708, and 709, which may all be formed from a single type of material. The focusing lens group 701 collects light from the field lens group 702, including the intermediate image 717. An aperture or mask can be placed at the aperture stop 718 to limit or modify the NA of the objective. The design presented in FIG. 7 has the advantages and flexibility described with respect to the design of FIG. 3. The lens prescription for this embodiment is shown in Table 5.

TABLE 5

Prescription for lenses for the design of FIG. 7

| Surf | Radius | Thickness | Glass | Diameter |
|---|---|---|---|---|
| OBJ | Infinity | Infinity | | 0.0 |
| 1 | Infinity | 23.8352 | | 9.4 |
| STO | Infinity | −23.8352 | | 8.8 |
| 3 | −37.3943 | 2.5000 | Fused silica | 9.4 |
| 4 | −11.9960 | 0.2500 | | 9.5 |
| 5 | 8.4950 | 1.6973 | Fused silica | 8.7 |
| 6 | 5.5741 | 4.0000 | | 7.6 |
| 7 | −5.5468 | 1.5000 | Fused silica | 7.5 |
| 8 | −7.5748 | 0.5000 | | 8.4 |
| 9 | 23.0221 | 2.5000 | Fused silica | 8.7 |
| 10 | −59.7532 | 0.5000 | | 8.7 |
| 11 | 6.2006 | 4.0067 | Fused silica | 8.5 |
| 12 | 5.9410 | 3.0486 | | 6.5 |
| 13 | Infinity | 1.2510 | | 5.9 |
| 14 | 21.1594 | 2.5000 | Fused silica | 5.5 |
| 15 | −8.3289 | 1.4531 | | 5.0 |
| 16 | 2.0000 | 2.2340 | Fused silica | 3.2 |
| 17 | 4.8552 | 0.7494 | | 1.4 |
| 18 | Infinity | 0.6996 | | 0.7 |
| 19 | −5.0128 | 1.5000 | Fused silica | 1.8 |
| 20 | −3.3963 | 0.2500 | | 3.2 |
| 21 | 17.8880 | 2.9998 | Fused silica | 25.0 |
| 22 | 14.3688 | 5.7794 | | 21.5 |
| 23 | −169.9762 | 4.0812 | Fused silica | 21.0 |
| 24 | −79.2615 | −4.0812 | MIRROR | 21.0 |
| 25 | −169.9762 | −5.7794 | | 21.0 |
| 26 | 14.3688 | −2.9998 | Fused silica | 21.5 |
| 27 | 17.8880 | 2.9998 | MIRROR | 25.0 |
| 28 | 14.3688 | 5.7794 | | 21.5 |
| 29 | −169.9762 | 4.0812 | Fused silica | 21.0 |
| 30 | −79.2615 | 0.1000 | | 21.0 |
| 31 | 2.9243 | 1.5000 | Fused silica | 3.5 |
| IMA | Infinity | | Immersion liquid | 0.1 |

Still another aspect of the present design presents an immersion objective with eight separate elements. This aspect of the design is presented in FIG. 8. The differences between the design of FIG. 8 and that of FIGS. 6 and 7 are a different catadioptric arrangement, fewer lens elements, and different correction wavelength, allowing the immersion objective to be corrected over a bandwidth from approximately 190 to 198 nm and simultaneously provide a field size of approximately 0.050 mm. The design of FIG. 8 maintains the high approximately 1.2 numerical aperture assuming pure water is used as an immersion substance, and other immersion substances could be used with higher refractive indices to further increase the NA. The worst case polychromatic wavefront error for the FIG. 8 design is approximately 0.05 waves.

Figure 8:
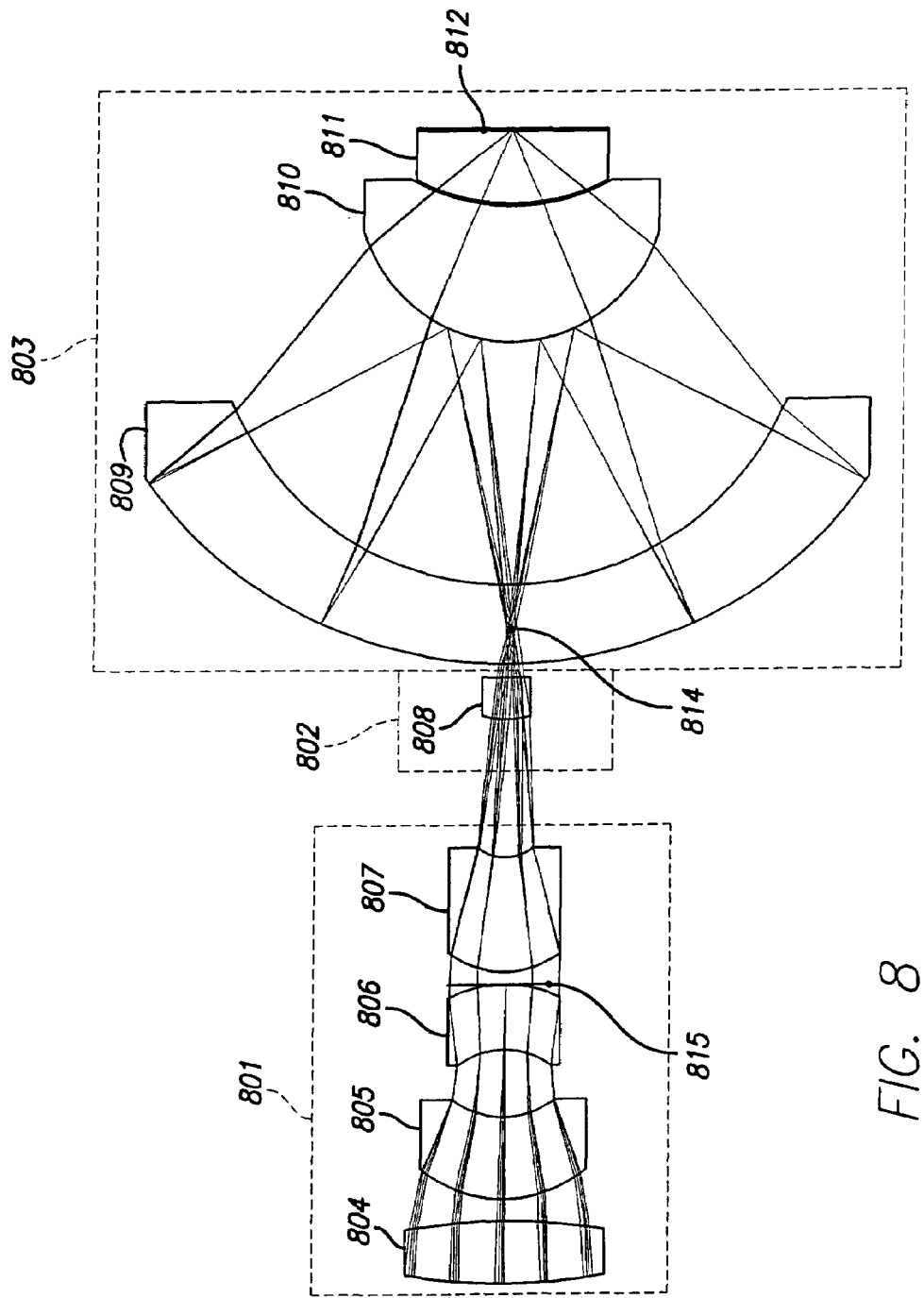
FIG. 8 is a eight element reduced size catadioptric immersion objective with a 1.2 NA in accordance with the present design, corrected over a bandwidth from 190 to 198 nm and having a field size of approximately 0.050 mm.

From FIG. 8, the catadioptric group 803 includes an immersion lens element 811, a Mangin mirror element 810, which is a reflectively coated lens element, and a concave spherical reflector 809, which is also a reflectively coated lens element. Mangin mirror element 810 has a central optical aperture where reflective material is absent. Concave spherical reflector 809 has a physical hole in the center of the element. The absence of reflective material in element 810 and the central hole in 809 allows light to pass from the specimen or object (not shown, but again positioned on the right side of the objective in the view shown), through immersion liquid 812, and immersion lens 811, through Mangin mirror element 810, reflect from the second surface of concave spherical reflector 809 onto the Mangin mirror element 810, and transmit through concave spherical reflector 809 to form an intermediate image 814 in proximity to concave spherical reflector 809 and field lens 808. Field lens group 802 comprises one field lens 808 in this aspect of the design.

The focusing lens group 801 employs multiple lens elements, in this aspect the four lens elements 804, 805, 806, and 807, which may all be formed from a single type of material. The focusing lens group 801 collects light from the field lens group 802, including the intermediate image 814. An aperture or mask can be placed at the aperture stop 815 to limit or modify the NA of the objective. The design presented in FIG. 8 has the advantages and flexibility described with respect to the design of FIG. 3. The lens prescription for this embodiment is shown in Table 6.

TABLE 6

Prescription for lenses for the design of FIG. 8

| Surf | Radius | Thickness | Glass | Diameter |
|---|---|---|---|---|
| OBJ | Infinity | Infinity | | 0.0 |
| 1 | Infinity | 18.0000 | | 7.3 |
| 2 | Infinity | −18.0000 | | 6.7 |
| 3 | 21.6009 | 2.2500 | Fused silica | 7.3 |
| 4 | −21.6009 | 0.8283 | | 7.1 |
| 5 | 5.0457 | 2.9908 | Fused silica | 6.1 |
| 6 | 3.0474 | 2.5000 | | 4.0 |
| 7 | −3.4102 | 2.4345 | Fused silica | 3.6 |
| 8 | −5.2993 | 0.0000 | | 4.1 |
| STO | Infinity | 0.0000 | | 4.1 |
| 10 | Infinity | 0.5000 | | 4.1 |
| 11 | 3.4327 | 4.1869 | Fused silica | 4.1 |
| 12 | 2.0000 | 5.1795 | | 2.2 |
| 13 | 3.1184 | 1.5000 | Fused silica | 1.8 |
| 14 | −17.0312 | 0.5000 | | 1.4 |
| 15 | 15.8489 | 3.0000 | | 0.0 |
| 16 | 10.9156 | 8.9489 | | 0.0 |
| 17 | 5.5736 | −8.9489 | MIRROR | 4.8 |
| 18 | 10.9156 | −3.0000 | Fused silica | 20.2 |
| 19 | 15.8489 | 3.0000 | MIRROR | 26.2 |
| 20 | 10.9156 | 8.9489 | | 20.2 |
| 21 | 5.5736 | 5.0086 | Fused silica | 10.8 |
| 22 | 7.6963 | 0.0500 | | 7.5 |
| 23 | 7.1686 | 2.7256 | Fused silica | 7.0 |
| 24 | Infinity | 0.1000 | Immersion liquid | 7.0 |
| IMA | Infinity | | Immersion liquid | 0.1 |

An alternate aspect of the present design employs a cover glass over the specimen and the associated objective corrects for the nominal thickness cover glass. An objective used for imaging purposes may be altered or reoptimized when using a cover glass, or alternately when using a cover glass in combination with an immersion liquid. Use of a cover glass may be particularly beneficial during inspection of biological materials. This aspect of the design is presented in FIG. 9. The objective illustrated is optimized for a nominal cover glass thickness of 0.17 mm and is corrected over a bandwidth from approximately 266 to 436 nm, with a field size of approximately 0.150 mm. The design of FIG. 9 maintains the high approximately 0.9 numerical aperture. Worst case polychromatic wavefront error for the FIG. 9 design is approximately 0.04 waves.

Figure 9:
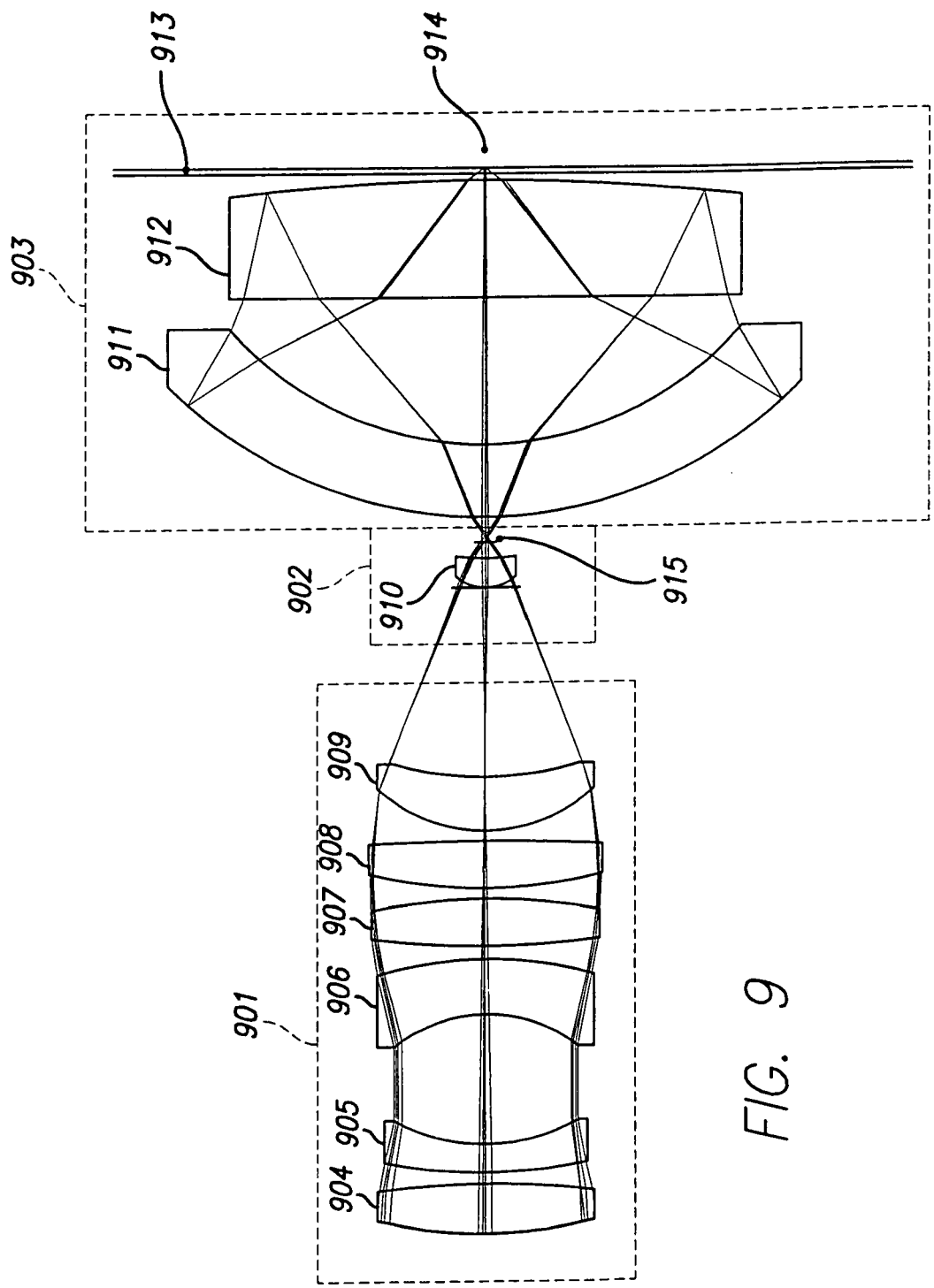
FIG. 9 shows a catadioptric objective design corrected for a 0.17 mm thick cover glass and can be adjusted correct for variations in the thickness of the cover glass.

From FIG. 9, the catadioptric group 903 includes a Mangin mirror element 912, a reflectively coated lens element, and concave spherical reflector 911, also a reflectively coated lens element. Mangin mirror elements 911 and 912 have central optical apertures free of reflective material. The absence of reflective material from elements 911 and 912 allows light to pass from the object or specimen 914, borders not shown, through cover glass 913, through Mangin mirror element 912, reflect from the second surface of concave spherical reflector 911 onto the Mangin mirror element 912, and transmit through concave spherical reflector 911 to form an intermediate image 915 in proximity to concave spherical reflector 911 and field lens group 902. Field lens group 902 comprises one field lens 910 in this aspect of the design.

The focusing lens group 901 employs multiple lens elements, in this aspect the six lens elements 904, 905, 906, 907, 908, and 909, which may all be formed from a single type of material. The focusing lens group 901 collects light from the field lens group 902, including the intermediate image 915. An aperture or mask can be placed at the aperture stop (not shown) to limit or modify the NA of the objective. The design presented in FIG. 9 again has the advantages and flexibility described with respect to the design of FIG. 3. The lens prescription for this embodiment is shown in Table 7.

TABLE 7

Prescription for lenses for the design of FIG. 9

| Surf | Radius | Thickness | Glass | Diameter |
|---|---|---|---|---|
| OBJ | Infinity | Infinity | | 0.00 |
| 1 | Infinity | 17.4042 | | 9.05 |
| STO | Infinity | −17.4042 | | 8.50 |
| 3 | 21.8272 | 2.0000 | Fused silica | 9.03 |
| 4 | −30.1966 | 0.5000 | | 8.85 |
| 5 | 21.2221 | 1.2500 | Fused silica | 8.38 |
| 6 | 7.4018 | 5.4944 | | 7.65 |
| 7 | −6.3015 | 2.3948 | Fused silica | 7.58 |
| 8 | −14.2766 | 0.5000 | | 8.88 |
| 9 | 49.7005 | 2.0000 | Fused silica | 9.37 |
| 10 | −21.4447 | 0.5000 | | 9.58 |
| 11 | 19.2912 | 2.0000 | Fused silica | 9.64 |
| 12 | −132.2143 | 0.5000 | | 9.46 |
| 13 | 6.6946 | 2.2500 | Fused silica | 8.91 |
| 14 | 17.2123 | 7.9753 | | 8.20 |
| 15 | Infinity | 0.0000 | | 2.84 |
| 16 | 1.9458 | 1.2495 | Fused silica | 2.52 |
| 17 | 6.2708 | 0.6796 | | 1.68 |
| 18 | Infinity | 0.0000 | | 0.79 |
| 19 | Infinity | 0.9995 | | 0.79 |
| 20 | 18.0063 | 3.0198 | Fused silica | 26.00 |
| 21 | 13.5996 | 6.2718 | | 21.00 |
| 22 | Infinity | 4.9453 | Fused silica | 21.00 |
| 23 | −78.6167 | −4.9453 | MIRROR | 21.00 |
| 24 | Infinity | −6.2718 | | 21.00 |
| 25 | 13.5996 | −3.0198 | Fused silica | 21.00 |
| 26 | 18.0063 | 3.0198 | MIRROR | 26.00 |
| 27 | 13.5996 | 6.2718 | | 21.00 |
| 28 | Infinity | 4.9453 | Fused silica | 21.00 |
| 29 | −78.6167 | 0.3006 | | 21.00 |
| 30 | Infinity | 0.0000 | | 0.41 |
| 31 | Infinity | 0.1700 | Fused silica (Cover glass) | 0.41 |
| IMA | Infinity | | Fused silica | 40.00 |

The actual thickness of cover glass may vary from the nominal value of 0.17 mm. Effective imaging suggests that the cover glass thickness may vary over a range of ±0.020 mm from the nominal and still employ an objective similar to that shown. The system may compensate for changes in the thickness of the cover glass by adjusting the spacing between the focusing lens group 901, the field lens group 902, and the catadioptric group 903. Table 8 summarizes the compensation.

TABLE 8

Compensation for variations in the cover glass
thickness of the design in FIG 9.

| Cover glass thickness (mm) | Object focus shift (mm) | Focusing lens group to Field lens group separation change (mm) | Field lens group to Catadiopptric group separation change (mm) | Resulting Polychromatic Strehl |
|---|---|---|---|---|
| 0.150 | −0.0086 | 0.0505 | 0.0233 | 0.86 |
| 0.160 | −0.0043 | 0.0252 | 0.0116 | 0.92 |
| 0.170 | 0.0 | 0.0 | 0.0 | 0.93 |
| 0.180 | 0.0042 | −0.0251 | −0.0115 | 0.90 |
| 0.190 | 0.0085 | −0.0502 | −0.0229 | 0.84 |

As can be seen from the table, decreasing the cover glass thickness can be corrected by increasing the distances between the focusing lens group, field lens group, and catadioptric group. Using this approach, element shifts may be performed by fixing the field lens group in a rotating ring and attaching the ring by threads or other rotary attachment device to the catadioptric group and focusing lens group. With threads of the proper pitch and direction on either side of the rotating ring, proper compensation can be achieved using one mechanical rotation motion. In operation, an operator or device may cause the ring to be rotated, thereby changing the distance between the field lens group and the focusing lens group, and simultaneously between the field lens group and the catadioptric group.

In addition, the change in distance separation between the focusing lens group and the field lens group can be made twice the change of the separation between the field lens group and catadioptric group with only a small performance penalty.

This technique of adjusting the air gaps between the focusing lens group, field lens group, and catadioptric group can also compensate for variations in the refractive index of the immersion fluid used in the designs of FIGS. 3-8.

Figure 10:
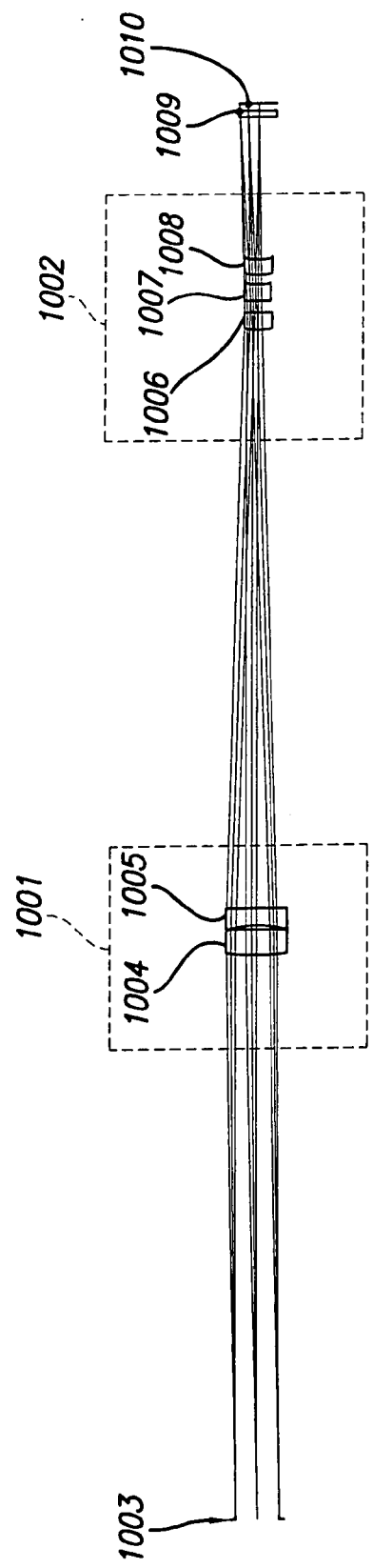
FIG. 10 is a self corrected varifocal imaging system with a 50 to 300× magnification range.

An alternate aspect of the present design presents a self corrected varifocal imaging optics system having five elements and being corrected over a wavelength range from 266-800 nm using two glass materials, fused silica and calcium fluoride. One aspect of such an objective design is shown in FIG. 10. This optical system can produce variable focal lengths from 200 mm to as large as desired. The only limitation is the total length of the system.

From FIG. 10, the varifocal optics include a fixed focusing group 1001 and a moving imaging group 1002. The fixed focusing group 1001 is located a desired distance from the objective exit pupil 1003. In this aspect of the invention, this separation distance is set to 100 mm. A 100 mm separation distance allows for insertion of beam splitters, phase plates, or filters between the objective and varifocal optics. The fixed focusing group 1001 includes two lenses 1004 and 1005 in this aspect of the invention. The moving imaging group 1002 includes three lens elements 1006, 1007, and 1008.

The lens prescription for the aspect of the invention illustrated in FIG. 10 is presented in Table 9.

TABLE 9

Prescription for lenses for the design of FIG. 10

| Surf | Radius | Thickness | Glass | Diameter |
|---|---|---|---|---|
| OBJ | Infinity | Infinity | | 0.00 |
| STO | Infinity | 100.0000 | | 8.10 |
| 2 | 51.6824 | 4.5000 | Calcium fluoride | 11.00 |
| 3 | −22.5040 | 0.1000 | | 10.84 |
| 4 | −22.7121 | 3.0000 | Fused silica | 10.81 |
| 5 | Infinity | 102.1114 | | 10.67 |
| 6 | 25.2044 | 3.0000 | Fused silica | 5.09 |
| 7 | 28.1765 | 2.0000 | | 4.79 |
| 8 | −31.3982 | 3.0000 | Calcium fluoride | 4.66 |
| 9 | 8.2051 | 1.5000 | | 4.65 |
| 10 | 9.2578 | 3.0000 | Fused silica | 5.07 |
| 11 | 37.0927 | 25.0000 | | 5.05 |
| 12 | Infinity | 1.0000 | Fused silica | 6.41 |
| 13 | Infinity | 1.0000 | | 6.45 |
| IMA | Infinity | | | 6.51 |

Total focal length of the system may be altered by changing the focal length of either the focusing group 1001 or the imaging group 1002. Increasing the focal length of the focusing group 1001 will increase the thickness of Surface 11 at the smallest desired focal length. Increasing the focal length of the focusing group 1001 will concurrently increase the thickness of Surface 11 at the largest desired focal length. Modification of the distance between the imaging group 1002 and the fixed focusing group 1001 changes the focal length of the varifocal optics. When the distance between focusing group 1001 and imaging group 1002 changes, the distance between the imaging group 1002 and the detector 1010 must also change to bring the image into focus. Window 1009 is typically fixed to the front of the detector to protect the detector and limit photocontamination. The focal length of the varifocal optics and the distances change according to Table 10.

TABLE 10

Lens group position and focal length
changes for the design of FIG. 10

| EFFL (Focal Length, mm) | Magnification using 4.5 mm focal length objective | Thickness of Surface 5 (mm) | Thickness of Surface 11 (mm) |
|---|---|---|---|
| 225 | 50× | 102.11 | 25.00 |
| 450 | 100× | 89.27 | 100 |
| 900 | 200× | 82.89 | 250 |
| 1800 | 400× | 79.69 | 555 |
| 3600 | 800× | 78.01 | 1250 |

The distance between the focusing group 1002 and the detector 1010 may be achieved by using movable mirrors or by moving the detector 1010. Moving the detector 1010 may be easiest when small focal lengths are desired. However, with large focal lengths, the necessary distance can increase rapidly. In the presence of a rapidly increasing distance, use of moving mirrors reduces the space required for refocusing.

Figure 11:
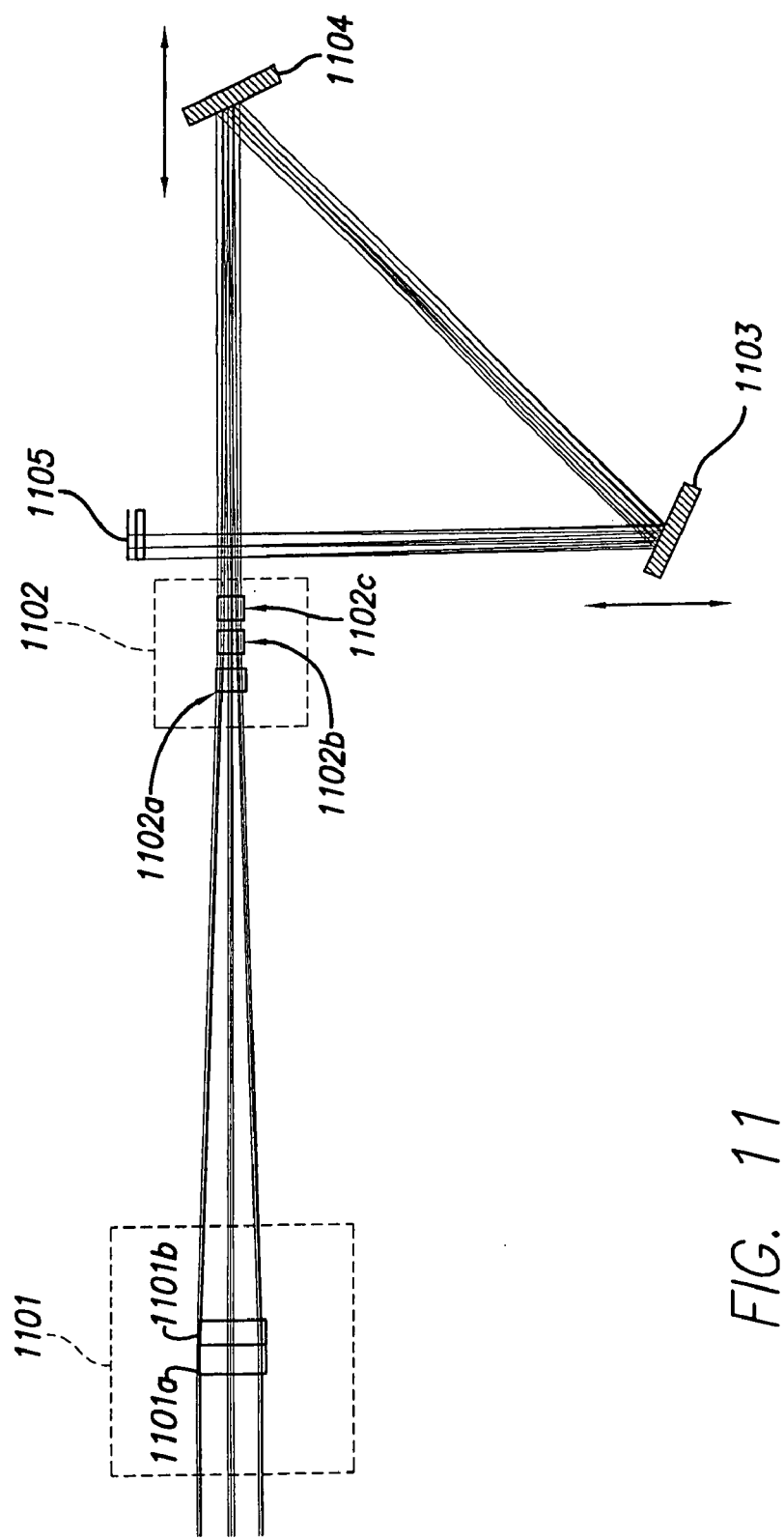
FIG. 11 is a "FIG. 4" mirror arrangement for use with the varifocal imaging system.

"Figure four" or "trombone mirror" geometries can assist in space reduction and providing effective inspection using the objectives presented. One possible "figure four" geometry is shown in FIG. 11. Light first enters fixed focusing group 1101, comprising lenses 1101a and 1101b, and is focused to imaging group 1102, comprising lenses 1102a, 1102b, and 1102c. Light then reflects off reflective surfaces or mirrors 1103 and 1104 before reaching detector 1105. The positions of mirrors 1103 and 1104 can be changed to increase or decrease the distance from imaging lens group 1102 to fixed detector 1105. This effectively brings the image into focus.

Figure 12:
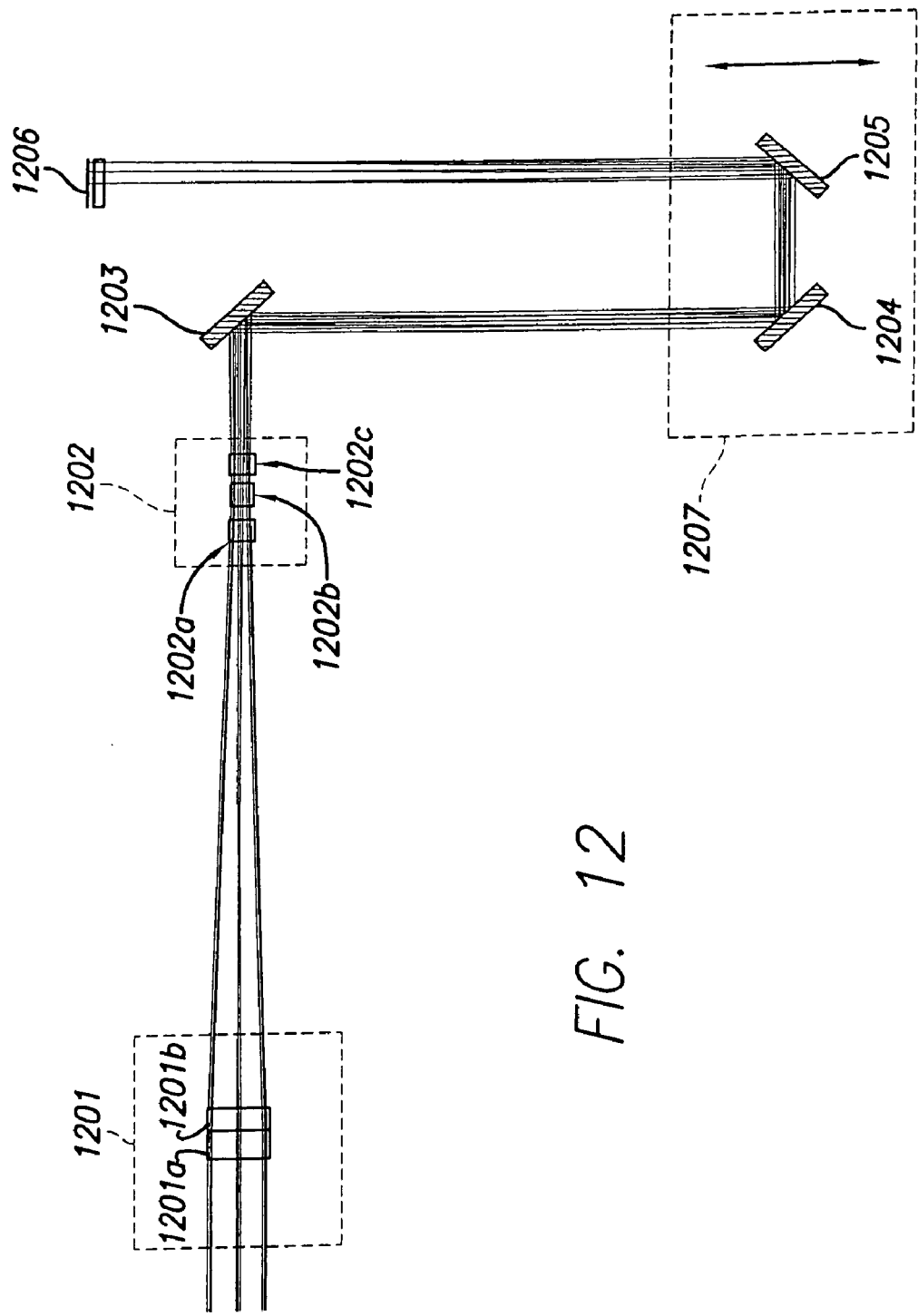
FIG. 12 is a "trombone" type mirror arrangement for use with the varifocal imaging system.

A "trombone geometry" may also be employed, and one possible design is shown in FIG. 12. Light enters fixed focusing group 1201, including lenses 1201a and 1201b, and is focused to imaging group 1202, comprising lenses 1202a, 1202b, and 1202c. Light then reflects from mirrors 1203, 1204, and 1205 before reaching detector 1206. The position of mirror group 1207, which in this embodiment is composed of mirrors 1204 and 1205, can be changed to increase or decrease the distance from imaging lens group 1202 to fixed detector 1206. The effect of this aspect of the design is to more adequately bring the image into focus.

The varifocal optics described in this embodiment can be of the same design as presented in Table 9. The moving mirrors only serve to adjust the air space between lens group 1202 and the detector. In the case where the varifocal optics are of the design presented in Table 9, the air space between the lens group 1202 and the detector can be adjusted according to the values in Table 10.

The present system design may be employed in various environments, including but not limited to lithography, microscopy, biological inspection, medical research, and the like.

The design presented herein and the specific aspects illustrated are meant not to be limiting, but may include alternate components while still incorporating the teachings and benefits of the invention, namely the small design using immersion liquid or liquids having a high NA, up to a range of 1.2, able to be employed in various wavelengths using different illumination modes. While the invention has thus been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

The design presented herein and the specific aspects illustrated are meant not to be limiting, but may include alternate components while still incorporating the teachings and benefits of the invention, namely the small design having a high NA able to be employed in various wavelengths using different illumination modes. While the invention has thus been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. An objective employed for use in inspecting a specimen, comprising:
    a focusing lens group configured to receive light energy and comprising at least one focusing lens;
    at least one field lens oriented to receive focused light energy from said focusing lens group and provide intermediate light energy;
    a Mangin mirror arrangement positioned to receive the intermediate light energy from the field lens and form controlled light energy, said Mangin mirror arrangement comprising at least three axially distributed elements comprising at least two elements having reflective surfaces; and
    an immersion substance located between said Mangin mirror arrangement and said specimen;
    said Mangin mirror arrangement imparting the controlled light energy to the specimen with a numerical aperture in excess of 0.9 and a field size of greater than or equal to approximately 0.10 mm;
    wherein all lenses are constructed of a single glass material.

2. The objective of claim 1, wherein said objective provides a relative bandwidth in excess of 0.5 in the presence of said light energy, said light energy having a wavelength in the range of approximately 157 nanometers through the infrared light range.

3. The objective of claim 1, said Mangin mirror arrangement comprising:
    a first lens/mirror element having substantially curved concave surfaces and a second surface reflection; and
    a second lens/mirror element having minimally curved surfaces and a second surface reflection.

4. The objective of claim 1, said Mangin mirror arrangement comprising:
    a first lens/mirror element having substantially curved concave surfaces and a second surface reflection; and
    a second lens/mirror element having minimally curved surfaces and a second surface reflection; and
    a third lens element having one surface in contact with the immersion substance.

5. The objective of claim 1, wherein each lens in the objective has a diameter of less than approximately 25 millimeters.

6. The objective of claim 1 where the numerical aperture is greater than approximately 0.9.

7. The objective of claim 1, where the numerical aperture is greater than or approximately equal to 1.1.

8. The objective of claim 1 wherein said objective comprises less than or equal to 11 elements.

9. The objective of claim 1, wherein the single glass material is fused silica.

10. The objective of claim 1, wherein the single glass material is calcium fluoride.

11. The objective of claim 1, wherein corrected bandwidth for the objective is less than approximately 0.9 with a center wavelength of approximately 633 nm.

12. The objective of claim 1, wherein corrected bandwidth is less than approximately 0.07 with a center wavelength of approximately 196 nm.

13. The objective of claim 1, wherein said objective may be located in a flange within a microscope, said flange positioned no more than approximately 45 millimeters from the specimen during normal operation.

14. The objective of claim 1, wherein said objective may be located in a flange within a microscope, said flange positioned no more than approximately 100 millimeters from the specimen during normal operation.

15. The objective of claim 1, wherein the immersion substance is primarily water.

16. The objective of claim 1, wherein the immersion substance is primarily oil.

17. The objective of claim 1, wherein the immersion substance is primarily silicone gel.

18. The objective of claim 1, wherein the objective is optimized to produce relatively minimal spherical aberration, axial color, and chromatic variation of aberrations.

19. The objective of claim 1, said objective having a numerical aperture of greater than approximately 1.0 at the specimen.

20. The objective of claim 1, wherein each lens in the objective has a diameter of less than approximately 35 millimeters.

21. The objective of claim 1, said objective having an ability to be employed with a microscope having a flange, wherein the flange may be located less than no more than approximately 45 millimeters from the specimen during normal operation.

22. The objective of claim 1, said objective employing no more than two glass materials.

23. The objective of claim 22, wherein the no more than two glass materials comprise fused silica and calcium fluoride.

24. The objective of claim 1, wherein the immersion substance comprises one from a group comprising water, oil, and silicone gel.

25. The objective of claim 24, configured to have a numerical aperture of at least approximately 1.1.

26. An objective configured for use in inspecting a specimen, comprising:
   a focusing lens group configured to receive light energy and comprising at least one focusing lens;
   at least one field lens oriented to receive focused light energy from said focusing lens group and provide intermediate light energy;
   a Mangin mirror arrangement positioned to receive the intermediate light energy from the at least one field lens and form controlled light energy, said Mangin mirror arrangement comprising at least three axially distributed elements comprising at least two elements having reflective surfaces; and
   an immersion substance located between said Mangin mirror arrangement and said specimen, wherein the third Mangin mirror element is in contact with the immersion substance;
   said Mangin mirror arrangement imparting the controlled light energy to the specimen with a numerical aperture in excess of 0.9 and a field size of greater than or equal to approximately 0.10 mm;
   wherein all lenses are constructed of a single glass material.

27. The objective of claim 26, said Mangin mirror arrangement comprising:
   a first lens/mirror element having substantially curved concave surfaces and a second surface reflection; and
   a second lens/mirror element having minimally curved surfaces and a second surface reflection.

28. The objective of claim 26, said Mangin mirror arrangement comprising:
   a first lens/mirror element having substantially curved concave surfaces and a second surface reflection; and
   a second lens/mirror element having minimally curved surfaces and a second surface reflection; and
   a third lens element having one surface in contact with the immersion substance.

29. The objective of claim 26, wherein each lens in the objective has a diameter of less than approximately 25 millimeters.

30. An objective employed for use in inspecting a specimen, comprising:
   a focusing lens group configured to receive light energy and comprising at least one focusing lens;
   at least one field lens oriented to receive focused light energy from said focusing lens group and provide intermediate light energy;
   a Mangin mirror arrangement comprising at least three axially distributed elements comprising at least two elements having reflective surfaces, the Mangin mirror arrangement configured to receive the intermediate light energy from the field lens and form controlled light energy; and
   an immersion substance located between a third axially distributed element of said Mangin mirror arrangement and said specimen;
   said Mangin mirror arrangement imparting the controlled light energy to the specimen with a numerical aperture in excess of 0.9 and a field size of greater than or equal to approximately 0.10 mm;
   wherein all lenses are constructed of a single glass material.

31. The objective of claim 30, said Mangin mirror arrangement comprising:
   a first lens/mirror element having substantially curved concave surfaces and a second surface reflection; and
   a second lens/mirror element having minimally curved surfaces and a second surface reflection.

32. The objective of claim 30, said Mangin mirror arrangement comprising:
   a first lens/mirror element having substantially curved concave surfaces and a second surface reflection; and
   a second lens/mirror element having minimally curved surfaces and a second surface reflection; and
   a third lens element having one surface in contact with the immersion substance.

* * * * *